(12) United States Patent
Nishiyama et al.

(10) Patent No.: US 6,727,033 B2
(45) Date of Patent: Apr. 27, 2004

(54) POSITIVE RESIST COMPOSITION

(75) Inventors: Fumiyuki Nishiyama, Shizuoka (JP); Toru Fujimori, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/285,502

(22) Filed: Nov. 1, 2002

(65) Prior Publication Data

US 2003/0134221 A1 Jul. 17, 2003

(30) Foreign Application Priority Data

Nov. 1, 2001 (JP) ........................................ 2001-336413

(51) Int. Cl.$^7$ ............................................... G03F 7/039
(52) U.S. Cl. ..................... 430/170; 430/270.1; 430/905
(58) Field of Search ............................. 430/170, 270.1, 430/905, 910

(56) References Cited

U.S. PATENT DOCUMENTS

| | | | |
|---|---|---|---|
| 4,491,628 A | 1/1985 | Ito et al. ................... | 430/270.1 |
| 6,242,153 B1 * | 6/2001 | Sato et al. ................ | 430/270.1 |
| 6,284,427 B1 * | 9/2001 | Okazaki et al. .......... | 430/270.1 |
| 6,465,150 B1 * | 10/2002 | Numata et al. .......... | 430/270.1 |
| 6,511,787 B2 * | 1/2003 | Harada et al. ........... | 430/270.1 |
| 2001/0024765 A1 * | 9/2001 | Okazaki et al. .......... | 430/270.1 |
| 2002/0058200 A1 * | 5/2002 | Fujimori et al. ......... | 430/270.1 |

FOREIGN PATENT DOCUMENTS

EP 0 249 139 3/1987

* cited by examiner

*Primary Examiner*—John S. Chu
(74) *Attorney, Agent, or Firm*—Sughrue Mion, PLLC

(57) ABSTRACT

A positive resist composition comprising a resin (A), which is decomposed by the action of an acid to increase solubility in an alkali developing solution, containing a structural unit including a group represented by formula (X) defined in the specification and/or a resin (B), which is decomposed by the action of an acid to increase solubility in an alkali developing solution, containing a structural unit including a group represented by formula (Y) defined in the specification, and a resin (C), which is decomposed by the action of an acid to increase solubility in an alkali developing solution, containing a structural unit including a group represented by formula (Q) defined in the specification; and a compound that generates an acid upon irradiation of an actinic ray or radiation.

17 Claims, No Drawings

POSITIVE RESIST COMPOSITION

FIELD OF THE INVENTION

The present invention relates to a positive resist composition suitable for use in the production, for example, of semiconductor integrated circuit elements, masks for producing integrated circuits, printed circuit boards and liquid crystal panels.

BACKGROUND OF THE INVENTION

As positive resist compositions, chemically amplified resist composition as described, for example, in U.S. Pat. No. 4,491,628 and European Patent 249,139 are known. The chemically amplified positive resist composition is a pattern formation material which generates an acid in an exposed area upon irradiation of radiation, for example, a far ultraviolet ray and due to a reaction using the acid as a catalyst, solubility in a developing solution differentiates in the area irradiated with the active radiation from the non-irradiated area to form a pattern on a substrate.

In general, the chemically amplified positive resist composition is roughly divided into three types, i.e., a three-component type, a two-component type and a hybrid type. The resist composition of three-component type comprises an alkali-soluble resin, a compound (hereinafter referred to as a "photo-acid generator" sometimes) that generates an acid upon irradiation of radiation and a dissolution inhibiting compound having an acid-decomposable group to the alkali-soluble resin. The resist composition of two-component type comprises a resin having a group capable of being decomposed by a reaction with an acid to become alkali-soluble and a photo-acid generator. The resist composition of hybrid type comprises a resin having a group capable of being decomposed by a reaction with an acid to become alkali-soluble, a low molecular weight dissolution inhibiting compound having an acid-decomposable group and a photo-acid generator.

Various techniques for improving performances are known wherein two or more resins, which are decomposed by the action of an acid to increase solubility in an alkali developing solution (hereinafter referred to as "acid-decomposable resin" sometimes) are used in combination in the chemically amplified positive resist compositions.

However, these techniques still have a problem in a performance of a linewidth variation rate caused by fluctuation of thickness of a resist film on a highly reflective substrate having irregularities (for example, bare silicon substrate or polysilicon substrate).

SUMMARY OF THE INVENTION

Therefore, an object of the present invention is to provide a chemically amplified positive resist composition in which the linewidth variation rate is small and which exhibits good performances without real damage even when provided on the highly reflective substrate having irregularities.

Other objects of the present invention will become apparent from the following description.

As a result of the intensive investigations on the chemically amplified positive resist compositions, it has been found that the objects of the present invention are accomplished by the positive resist composition comprising two kinds of resins having acid-decomposable groups of specific structures to complete the present invention.

The positive resist composition of the present invention includes the following constructions.

(1) A positive resist composition comprising: (a) a resin (A), which is decomposed by the action of an acid to increase solubility in an alkali developing solution, containing a structural unit including a group represented by formula (X) shown below and/or a resin (B), which is decomposed by the action of an acid to increase solubility in an alkali developing solution, containing a structural unit including a group represented by formula (Y) shown below, and a resin (C), which is decomposed by the action of an acid to increase solubility in an alkali developing solution, containing a structural unit including a group represented by formula (Q) shown below; and (b) a compound that generates an acid upon irradiation of an actinic ray or radiation.

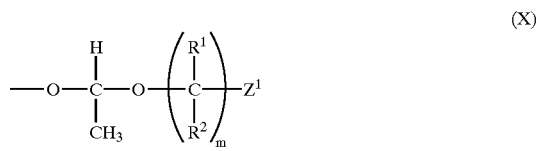
(X)

In formula (X), $R^1$ and $R^2$, which may be the same or different, each represent a hydrogen atom or an alkyl group which may have a substituent; m represents an integer of from 1 to 20; and $Z^1$ represents

In the formulae above, $R^3$ represents an alkyl group which may have a substituent, an aryl group which may have a substituent or an aralkyl group which may have a substituent; and n represents an integer of from 0 to 5,

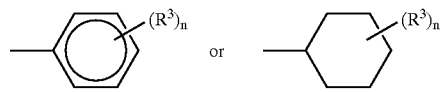
(Y)

In formula (Y), $R^4$ represents an alkyl group,

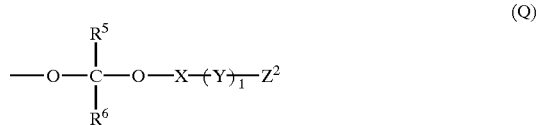
(Q)

In formula (Q), $R^5$ and $R^6$, which may be the same or different, each represent a hydrogen atom or an alkyl group; X represents an alkylene group which may have a substituent; Y represents a divalent connecting group; $Z^2$ represents a heterocyclic group which may have a substituent; and l represents 0 or 1.

(2) The positive resist composition as described in item (1) above, wherein the compound that generates an acid upon irradiation of an actinic ray or radiation of component (b) is a compound having a sulfonium salt structure or a compound having a diazodisulfone structure.

(3) The positive resist composition as described in item (1) above, wherein the compound that generates an acid upon irradiation of an actinic ray or radiation of component (b) is a combination of a compound having a sulfonium salt structure and a compound having a diazodisulfone structure.

DETAILED DESCRIPTION OF THE INVENTION

The positive resist composition of the present invention will be described in more detail below.

(a-1) Resin (A), which is decomposed by the action of an acid to increase solubility in an alkali developing solution, containing a structural unit including a group represented by formula (X) described above:

In formula (X), $R^1$ and $R^2$, which may be the same or different, each represent a hydrogen atom or an alkyl group which may have a substituent, and m represents an integer of from 1 to 20.

The alkyl group represented by $R^1$ or $R^2$ may be a straight chain, branched or cyclic alkyl group.

The straight chain alkyl group has preferably from 1 to 30 carbon atoms, more preferably from 1 to 20 carbon atoms, and includes, for example, methyl, ethyl, n-propyl, n-butyl, n-pentyl, n-hexyl, n-heptyl, n-octyl, n-nonyl and n-decyl groups.

The branched alkyl group has preferably from 3 to 30 carbon atoms, more preferably from −3 to 20 carbon atoms, and includes, for example, isopropyl, isobutyl, tert-butyl, isopentyl, tert-pentyl, isohexyl, tert-hexyl, isoheptyl, tert-heptyl, isooctyl, tert-octyl, isononyl and tert-decyl groups.

The cyclic alkyl group has preferably from 3 to 30 carbon atoms, more preferably from 3 to 20 carbon atoms, and includes, for example, cyclopropyl, cyclobutyl, cyclopentyl, cyclohexyl, cycloheptyl, cyclooctyl, cyclononyl and cyclodecyl groups.

In the groups represented by $Z^1$, $R^3$ represents an alkyl group which may have a substituent, an aryl group which may have a substituent or an aralkyl group which may have a substituent. The alkyl group may be a straight chain, branched or cyclic alkyl group. n represents an integer of from 0 to 5.

The straight chain or branched alkyl group represented by $R^3$ has preferably up to 30 carbon atoms, more preferably up to 20 carbon atoms, and includes, for example, methyl, ethyl, n-propyl, isopropyl, n-butyl, isobutyl, tert-butyl, n-pentyl, isopentyl, tert-pentyl, n-hexyl, isohexyl, tert-hexyl, n-heptyl, isoheptyl, tert-heptyl, n-octyl, isooctyl, tert-octyl, n-nonyl, isononyl, tert-nonyl, n-decyl, isodecyl, tert-decyl, n-undecyl, isoundecyl, n-dodecyl, isododecyl, n-tridecyl, isotridecyl, n-tetradecyl, isotetradecyl, n-pentadecyl, isopentadecyl, n-hexadecyl, isohexadecyl, n-heptadecyl, isoheptadecyl, n-octadecyl, isooctadecyl, n-nonadecyl and isononadecyl groups.

The cyclic alkyl group represented by $R^3$ has preferably from 3 to 30 carbon atoms, more preferably from 3 to 20 carbon atoms. The cyclic alkyl group may be a cycloalkyl group including a ring containing up to 20 carbon atoms or a cycloalkyl group having a substituent. The cyclic alkyl group includes, for example, cyclopropyl, cyclobutyl, cyclopentyl, cyclohexyl, cycloheptyl, cyclooctyl, cyclononyl, cyclodecyl, cycloundecyl, cyclododecyl, cyclotridecyl, cyclotetradecyl, cyclopentadecyl, cyclohexadecyl, cycloheptadecyl, cyclooctadecyl, cyclononadecyl, 4-cyclohexylcyclohexyl, 4-n-hexylcyclohexyl, pentylcyclohexyl, hexyloxycyclohexyl and pentyloxycyclohexyl groups. Substituted cycloalkyl groups other than those described above may be used as long as they have carbon atoms within the above described range.

The aryl group represented by $R^3$ has preferably from 6 to 30 carbon atoms, more preferably from 6 to 20 carbon atoms, and includes, for example, phenyl, 4-methylphenyl, 3-methylphenyl, 2-methylphenyl, 4-ethylphenyl, 3-ethylphenyl, 2-ethylphenyl, 4-n-propylphenyl, 3-n-propylphenyl, 2-n-propylphenyl, 4-isopropylphenyl, 3-isopropylphenyl, 2-isopropylphenyl, 4-cyclopropylphenyl, 3-cyclopropylphenyl, 2-cyclopropylphenyl, 4-n-butylphenyl, 3-n-butylphenyl, 2-n-butylphenyl, 4-isobutylphenyl, 3-isobutylphenyl, 2-isobutylphenyl, 4-tert-butylphenyl, 3-tert-butylphenyl, 2-tert-butylphenyl, 4-cyclobutylphenyl, 3-cyclobutylphenyl, 2-cyclobutylphenyl, 4-cyclopentylphenyl, 4-cyclohexylphenyl, 4-cycloheptylphenyl, 4-cyclooctylphenyl, 2-cyclopentylphenyl, 2-cyclohexylphenyl, 2-cycloheptylphenyl, 2-cyclooctylphenyl, 3-cyclopentylphenyl, 3-cyclohexylphenyl, 3-cycloheptylphenyl, 3-cyclooctylphenyl, 4-cyclopentyloxyphenyl, 4-cyclohexyloxyphenyl, 4-cycloheptyloxyphenyl, 4-cyclooctyloxyphenyl, 2-cyclopentyloxyphenyl, 2-cyclohexyloxyphenyl, 2-cycloheptyloxyphenyl, 2-cyclooctyloxyphenyl, 3-cyclopentyloxyphenyl, 3-cyclohexyloxyphenyl, 3-cyclooctyloxyphenyl, 4-n-pentylphenyl, 4-n-hexylphenyl, 4-n-heptylphenyl, 4-n-octylphenyl, 2-n-pentylphenyl, 2-n-hexylphenyl, 2-n-heptylphenyl, 2-n-octylphenyl, 3-n-pentylphenyl, 3-n-hexylphenyl, 3-n-heptylphenyl, 3-n-octylphenyl, 2,6-diisopropylphenyl, 2,3-diisopropylphenyl, 2,4-diisopropylphenyl, 3,4-diisopropylphenyl, 2,6-di-tert-butylphenyl, 2,3-di-tert-butylphenyl, 2,4-di-tert-butylphenyl, 3,4-di-tert-butylphenyl, 2,6-di-n-butylphenyl, 2,3-di-n-butylphenyl, 2,4-di-n-butylphenyl, 3,4-di-n-butylphenyl, 2,6-diisobutylphenyl, 2,3-diisobutylphenyl, 2,4-diisobutylphenyl, 3,4-diisobutylphenyl, 2,6-di-tert-amylphenyl, 2,3-di-tert-amylphenyl, 2,4-di-tert-amylphenyl, 3,4-di-tert-amylphenyl, 2,6-diisoamylphenyl, 2,3-diisoamylphenyl, 2,4-diisoamylphenyl, 3,4-diisoamylphenyl, 2,6-di-n-pentylphenyl, 2,3-di-n-pentylphenyl, 2,4-di-n-pentylphenyl, 3,4-di-n-pentylphenyl, 4-adamantylphenyl, 2-adamantylphenyl, 4-isobornylphenyl, 3-isobornylphenyl, 2-isobornylphenyl, 4-cyclopentyloxyphenyl, 4-cyclohexyloxyphenyl, 4-cycloheptyloxyphenyl, 4-cyclooctyloxyphenyl, 2-cyclopentyloxyphenyl, 2-cyclohexyloxyphenyl, 2-cycloheptyloxyphenyl, 2-cyclooctyloxyphenyl, 3-cyclopentyloxyphenyl, 3-cyclohexyloxyphenyl, 3-cycloheptyloxyphenyl, 3-cyclooctyloxyphenyl, 4-n-pentyloxyphenyl, 4-n-hexyloxyphenyl, 4-n-heptyloxyphenyl, 4-n-octyloxyphenyl, 2-n-pentyloxyphenyl, 2-n-hexyloxyphenyl, 2-n-heptyloxyphenyl, 2-n-octyloxyphenyl, 3-n-pentyloxyphenyl, 3-n-hexyloxyphenyl, 3-n-heptyloxyphenyl, 3-n-octyloxyphenyl, 2,6-diisopropyloxyphenyl, 2,3-diisopropyloxyphenyl, 2,4-diisopropyloxyphenyl, 3,4-diisopropyloxyphenyl, 2,6-di-tert-butyloxyphenyl, 2,3-di-tert-butyloxyphenyl, 2,4-di-tert-butyloxyphenyl, 3,4-di-tert-butyloxyphenyl, 2,6-di-n-butyloxyphenyl, 2,3-di-n-butyloxyphenyl, 2,4-di-n-butyloxyphenyl, 3,4-di-n-butyloxyphenyl, 2,6-diisobutyloxyphenyl, 2,3-diisobutyloxyphenyl, 2,4-diisobutyloxyphenyl, 3,4-diisobutyloxyphenyl, 2,6-di-tert-amyloxyphenyl, 2,3-di-tert-amyloxyphenyl, 2,4-di-tert-amyloxyphenyl, 3,4-di-tert-amyloxyphenyl, 2,6-diisoamyloxyphenyl, 2,3-diisoamyloxyphenyl, 2,4-diisoamyloxyphenyl, 3,4-diisoamyloxyphenyl, 2,6-di-n-pentyloxyphenyl, 2,3-di-n-pentyloxyphenyl, 2,4-di-n-pentyloxyphenyl, 3,4-di-n-pentyloxyphenyl, 4-adamantyloxyphenyl, 3-adamantyloxyphenyl, 2-adamantyloxyphenyl, 4-isobornyloxyphenyl, 3-isobornyloxyphenyl and 2-isobornyloxyphenyl. These examples of the aryl group may further have substituents other than those described above as long as they have carbon atoms within the above described range.

The aralkyl group represented by $R^3$ has preferably from 7 to 30 carbon atoms, more preferably from 7 to 20 carbon atoms, and includes, for example, phenylethyl, 4-methylphenylethyl, 3-methylphenylethyl, 2-methylphenylethyl, 4-ethylphenylethyl, 3-ethylphenylethyl, 2-ethylphenylethyl, 4-n-propylphenylethyl, 3-n-propylphenylethyl, 2-n-propylphenylethyl, 4-isopropylphenylethyl, 3-isopropylphenylethyl, 2-isopropylphenylethyl, 4-cyclopropylphenylethyl, 3-cyclopropylphenylethyl, 2-cyclopropylphenylethyl, 4-n-butylphenylethyl, 3-n-butylphenylethyl, 2-n-butylphenylethyl, 4-isobutylphenylethyl, 3-isobutylphenylethyl, 2-isobutylphenylethyl, 4-tert-butylphenylethyl, 3-tert-butyiphenylethyl, 2-tert-butyiphenylethyl, 4-cyclobutylphenylethyl, 3-cyclobutylphenylethyl, 2-cyclobutylphenylethyl, 4-cyclopentylphenylethyl, 4-cyclohexylphenylethyl, 4-cyclohepylphenylethyl, 4-cyclooctylphenylethyl, 2-cyclopentylphenylethyl, 2-cyclohexylphenylethyl, 2-cyclohepylphenylethyl, 2-cyclooctylphenylethyl, 3-cyclopentylphenylethyl, 3-cyclohexylphenylethyl, 3-cyclohepylphenylethyl, 3-cyclooctylphenylethyl, 4-cyclopentyloxyphenylethyl, 4-cyclohexyloxyphenylethyl, 4-cyclohepyloxyphenylethyl, 4-cyclooctyloxyphenylethyl, 2-cyclopentyloxyphenyl, 2-cyclohexyloxyphenyl, 2-cyclohepyloxyphenylethyl, 2-cyclooctyloxyphenylethyl, 3-cyclopentyloxyphenylethyl, 3-cyclohexyloxyphenylethyl, 3-cyclohepyloxyphenylethyl, 3-cyclooctyloxyphenylethyl, 4-n-pentylphenylethyl, 4-n-hexylphenylethyl, 4-n-heptylphenylethyl, 4-n-octylphenylethyl, 2-n-pentylphenylethyl, 2-n-hexylphenylethyl, 2-n-heptylphenylethyl, 2-n-octylphenylethyl, 3-n-pentylphenylethyl, 3-n-hexylphenylethyl, 3-n-heptylphenylethyl, 3-n-octylphenylethyl, 2,6-diisopropylphenylethyl, 2,3-diisopropylphenylethyl, 2,4-diisopropylphenylethyl, 3,4-diisopropylphenylethyl, 2,6-di-tert-butylphenylethyl, 2,3-di-tert-butylphenylethyl, 2,4-di-tert-butylphenylethyl, 3,4-di-tert-butylphenylethyl, 2,6-di-n-butylphenylethyl, 2,3-di-n-butylphenylethyl, 2,4-di-n-butylphenylethyl, 3,4-di-n-butylphenylethyl, 2,6-diisobutylphenylethyl, 2,3-diisobutylphenylethyl, 2,4-diisobutylphenylethyl, 3,4-diisobutylphenylethyl, 2,6-di-tert-amylphenylethyl, 2,3-di-tert-amylphenylethyl, 2,4-di-tert-amylphenylethyl, 3,4-di-tert-amylphenylethyl, 2,6-diisoamylphenylethyl, 2,3-diisoamylphenylethyl, 2,4-diisoamylphenylethyl, 3,4-diisoamylphenylethyl, 2,6-di-n-pentylphenylethyl, 2,3-di-n-pentylphenylethyl, 2,4-di-n-pentylphenylethyl, 3,4-di-n-pentylphenylethyl, 4-adamantylphenylethyl, 3-adamantylphenylethyl, 2-adamantylphenylethyl, 4-isobornylphenylethyl, 3-isobornylphenylethyl, 2-isobornylphenylethyl, 4-cyclopentyloxyphenylethyl, 4-cyclohexyloxyphenylethyl, 4-cycloheptyloxyphenylethyl, 4-cyclooctyloxyphenylethyl, 2-cyclopentyloxyphenylethyl, 2-cyclohexyloxyphenylethyl, 2-cycloheptyloxyphenylethyl, 2-cyclooctyloxyphenylethyl, 3-cyclopentyloxyphenylethyl, 3-cyclohexyloxyphenylethyl, 3-cycloheptyloxyphenylethyl, 3-cyclooctyloxyphenylethyl, 4-n-pentyloxyphenylethyl, 4-n-hexyloxyphenylethyl, 4-n-heptyloxyphenylethyl, 4-n-octyloxyphenylethyl, 2-n-pentyloxyphenylethyl, 2-n-hexyloxyphenylethyl, 2-n-heptyloxyphenylethyl, 2-n-octyloxyphenylethyl, 3-n-pentyloxyphenylethyl, 3-n-hexyloxyphenylethyl, 3-n-heptyloxyphenylethyl, 3-n-octyloxyphenylethyl, 2,6-diisopropyloxyphenylethyl, 2,3-diisopropyloxyphenylethyl, 2,4-diisopropyloxyphenylethyl, 3,4-diisopropyloxyphenylethyl, 2,6-di-tert-butyloxyphenylethyl, 2,3-di-tert-butyloxyphenylethyl, 2,4-di-tert-butyloxyphenylethyl, 3,4-di-tert-butyloxyphenylethyl, 2,6-di-n-butyloxyphenylethyl, 2,3-di-n-butyloxyphenylethyl, 2,4-di-n-butyloxyphenylethyl, 3,4-di-n-butyloxyphenylethyl, 2,6-diisobutyloxyphenylethyl, 2,3-diisobutyloxyphenylethyl, 2,4-diisobutyloxyphenylethyl, 3,4-diisobutyloxyphenylethyl, 2,6-di-tert-amyloxyphenylethyl, 2,3-di-tert-amyloxyphenylethyl, 2,4-di-tert-amyloxyphenylethyl, 3,4-di-tert-amyloxyphenylethyl, 2,6-diisoamyloxyphenylethyl, 2,3-diisoamyloxyphenylethyl, 2,4-diisoamyloxyphenylethyl, 3,4-diisoamyloxyphenylethyl, 2,6-di-n-pentyloxyphenylethyl, 2,3-di-n-pentyloxyphenylethyl, 2,4-di-n-pentyloxyphenylethyl, 3,4-di-n-pentyloxyphenylethyl, 4-adamantyloxyphenylethyl, 3-adamantyloxyphenylethyl, 2-adamantyloxyphenylethyl, 4-isobornyloxyphenylethyl, 3-isobornyloxyphenylethyl and 2-isobornyloxyphenylethyl, and groups wherein the ethyl groups in the above specific examples of the aralkyl group are replaced by other alkyl groups, for example, methyl groups, propyl groups or butyl groups.

Examples of the substituent for the above described groups include a hydroxy group, a halogen atom (e.g., fluorine, chlorine, bromine or iodine), a nitro group, a cyano group, an alkyl group, an alkoxy group (e.g., methoxy, ethoxy, hydroxyethoxy, propoxy, hydroxypropoxy, n-butoxy, isobutoxy, sec-butoxy or tert-butoxy), an alkoxycarbonyl group (e.g., methoxycarbonyl or ethoxycarbonyl), an aralkyl group (e.g., benzyl phenethyl or cumyl), an aralkyloxy group, an acyl group (e.g., formyl, acetyl, butyryl, benzoyl, cinnamoyl or valeryl), an acyloxy group (e.g., butyryloxy), an alkenyl group, an alkenyloxy group (e.g., vinyloxy, propenyloxy, allyoxy or butenyloxy), an aryl group, an aryloxy group (e.g., phenyloxy) and an aryloxycarbonyl group (e.g., phenyloxycarbonyl).

$R^3$ preferably represents an alkyl group having from 1 to 20 carbon atoms, an aryl group having from 6 to 20 carbon atoms or an aralkyl group having from 7 to 20 carbon atoms. These groups may further have a substituent.

Specific examples of the group represented by formula (X) are set forth below, but the present invention should not be construed as being limited thereto.

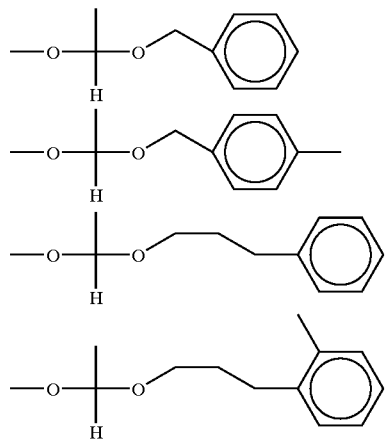

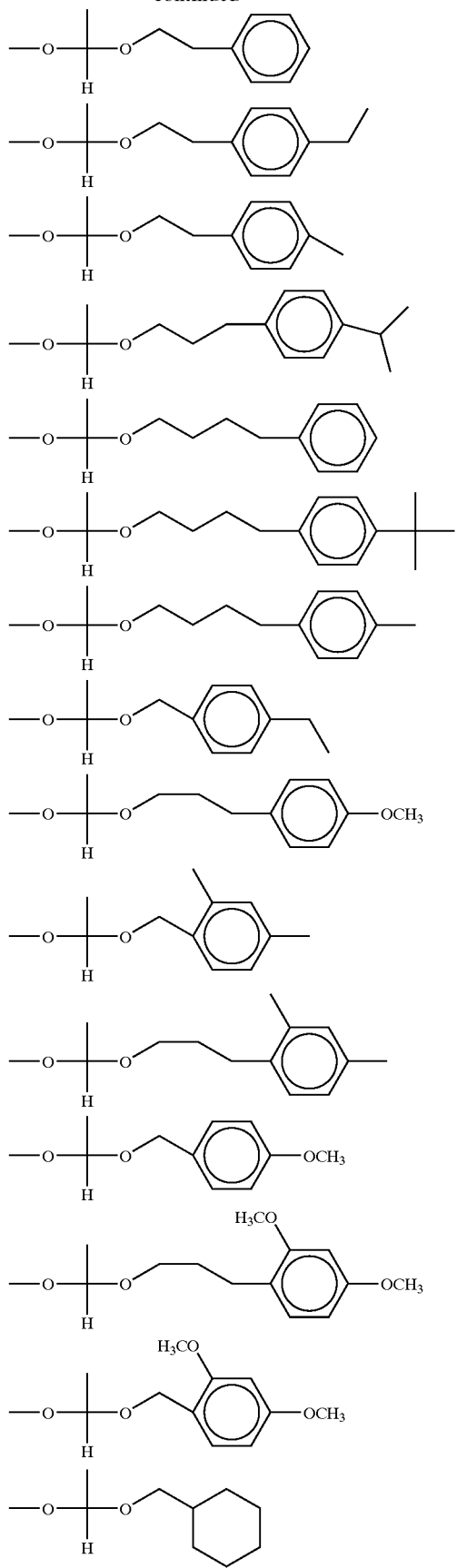
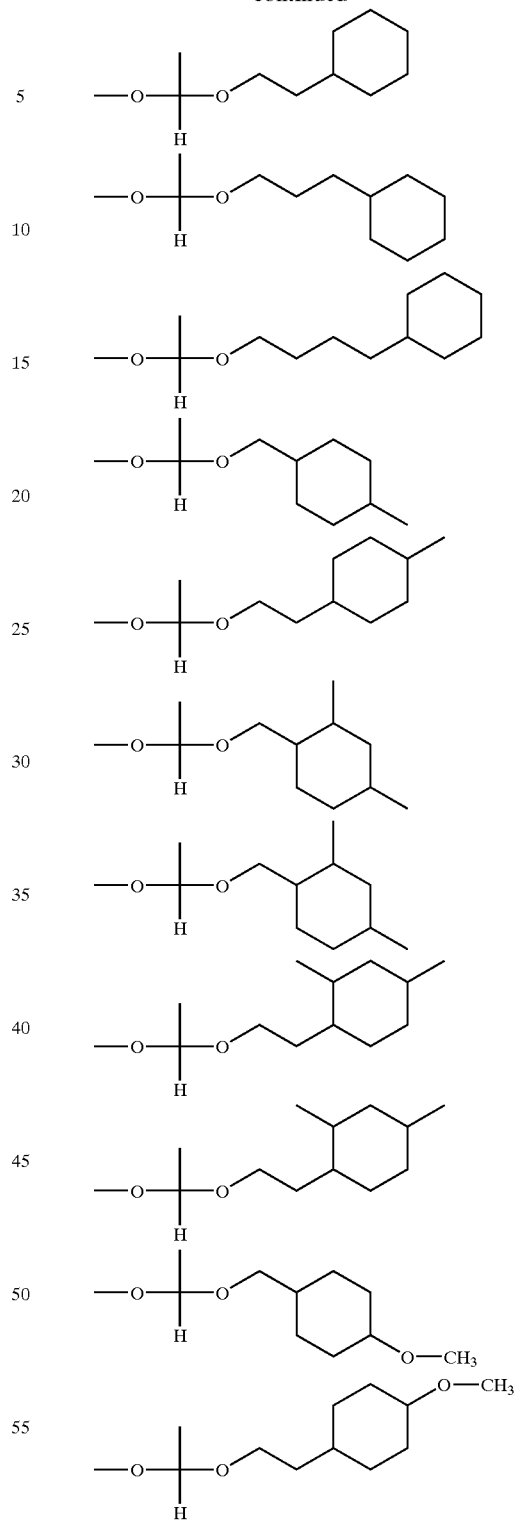

Resin (A), which is decomposed by the action of an acid to increase solubility in an alkali developing solution, containing a structural unit including a group represented by formula (X) (hereinafter also referred to as a resin having a group represented by formula (X)) is a compound that becomes alkali-soluble by the action of an acid and has a structure obtained by introducing an acid-decomposable group represented by formula (X) into a compound having a molecular weight distribution obtained by polymerization of monomer.

The resin having a group represented by formula (X) includes resins having a group represented by formula (X) in the main chain thereof, the side chain thereof or both of the main chain and side chain thereof. Of the resins, those having a group represented by formula (X) in the side chain thereof are more preferred.

A parent resin in the case wherein the group represented by formula (X) is bonded as a side chain includes an alkali-soluble resin having an —OH group or a —COOH group, preferably an —R⁰—COOH group or an —Ar—OH group, in the side chain. In the above formulae, —R⁰— represents a two or higher valent aliphatic or aromatic hydrocarbon group which may have a substituent and —Ar— represents a two or higher valent monocyclic or polycyclic aromatic group which may have a substituent.

The parent resin preferably used in the present invention includes an alkali-soluble resin having a phenolic hydroxy group.

Of the alkali-soluble resins having a phenolic hydroxy group, a copolymer containing at least 30% by mole, preferably at least 50% by mole, of a repeating unit corresponding to o-, m- or p-hydroxystyrene (collectively referred to as hydroxystyrene) or o-, m- or p-hydroxy-α-methylstyrene (collectively referred to as hydroxy-α-methylstyrene), a homopolymer thereof, and such a copolymer or homopolymer wherein the benzene ring in the repeating unit described above is partially hydrogenated are preferable. p-Hydroxystyrene homopolymer is more preferred.

Monomers other than the hydroxystyrene and hydroxy-α-methylstyrene, which can be used for the preparation of copolymer, include preferably an acrylic ester, a methacrylic ester, an acrylamide, a methacrylamide, acrylonitrile, methacrylonitrile, maleic anhydride, styrene, α-methylstyrene, acetoxystyrene and an alkoxystyrene, more preferably styrene, acetoxystyrene and tert-butoxystyrene.

A content of the repeating unit (structural unit) including a group represented by formula (X) in the resin is preferably from 5 to 50% by mole, more preferably from 5 to 30% by mole, based on the total repeating unit of the resin.

The resin including a group represented by formula (X) according to the present invention may also contain an acid-decomposable group other than the group represented by formula (X).

The resin including a group represented by formula (X) can be obtained by synthesizing a corresponding vinyl ether and reacting the vinyl ether with an alkali-soluble resin having a phenolic hydroxy group dissolved in an appropriate solvent, for example, tetrahydrofuran in a conventional manner. The reaction is carried out ordinarily in the presence of an acidic catalyst, preferably an acidic ion exchange resin, hydrochloric acid, p-toluenesulfonic acid or a salt, for example, pyridinium tosylate. The corresponding vinyl ether can be synthesized, for example, by a method using a nucleophilic substitution reaction from an active starting material, e.g., chloroethyl vinyl ether or a method using a mercury or palladium catalyst.

According to another method, the vinyl ether can also be synthesized by an acetal exchange method using a corresponding alcohol and a vinyl ether. In such a case, the reaction is conducted by mixing an alcohol having the desired substituent to be introduced and a relatively unstable vinyl ether, for example, tert-butyl vinyl ether in the presence of an acidic catalyst, for example, p-toluenesulfonic acid or pyridinium tosylate.

Specific preferred examples of the structure of the resin (A) including a group represented by formula (X) are set forth below, but the present invention should not be construed as being limited thereto.

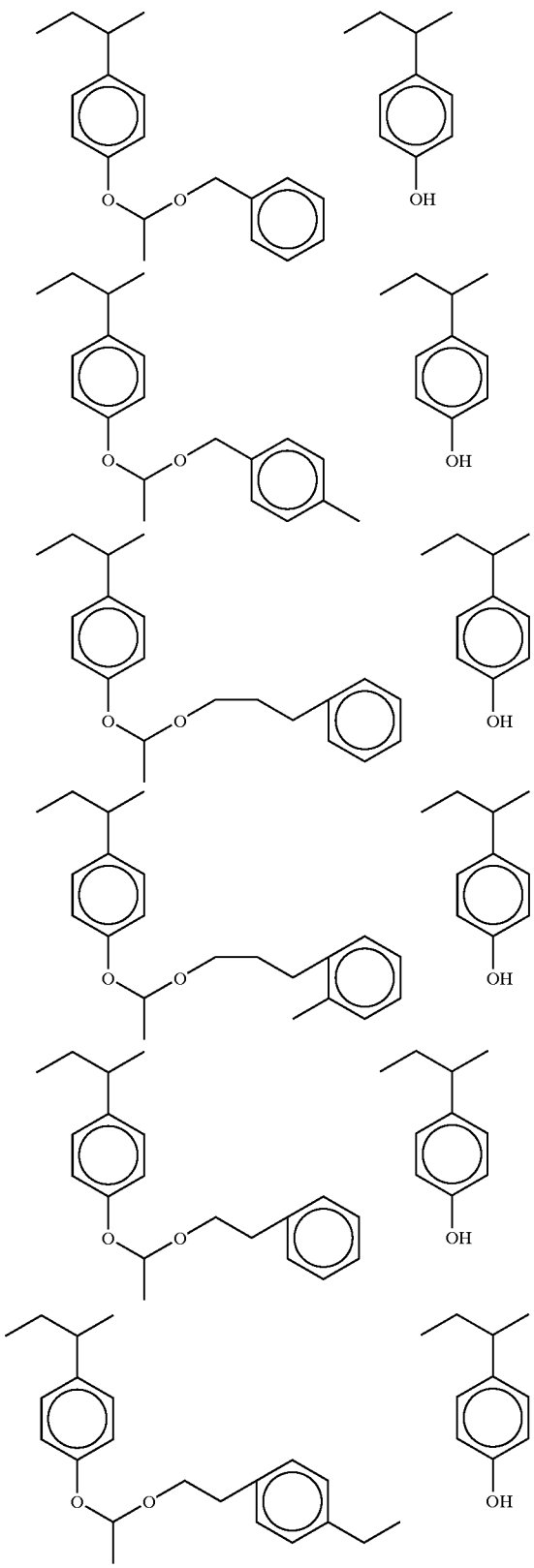

-continued
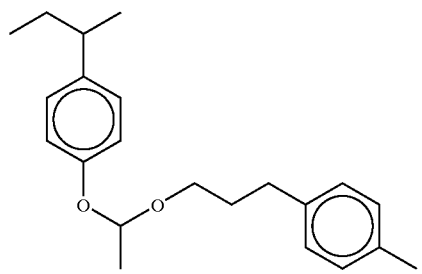 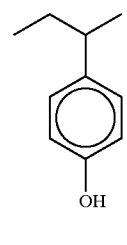
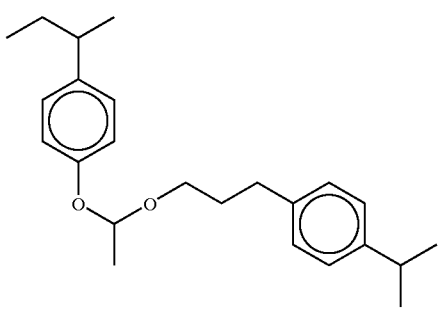 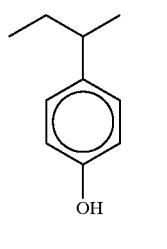
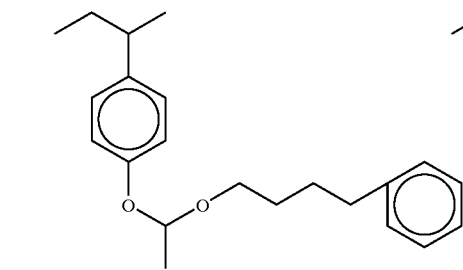 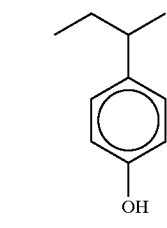
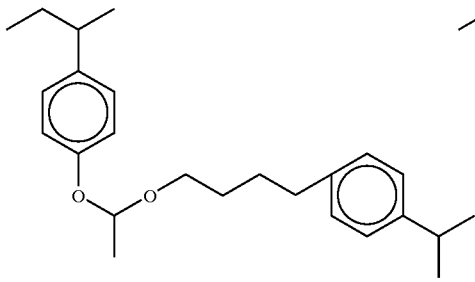 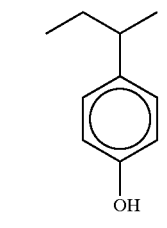
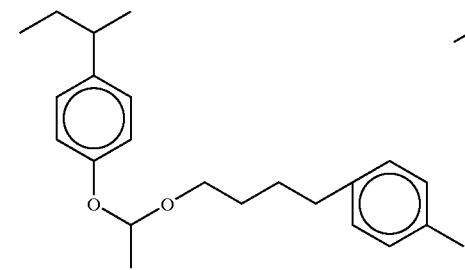 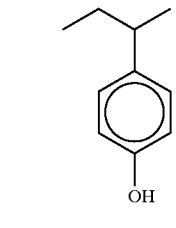
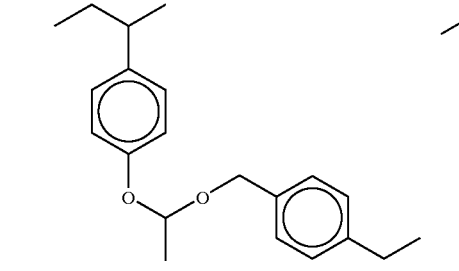 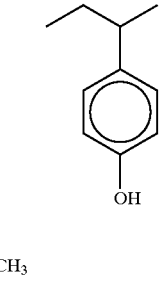
-continued
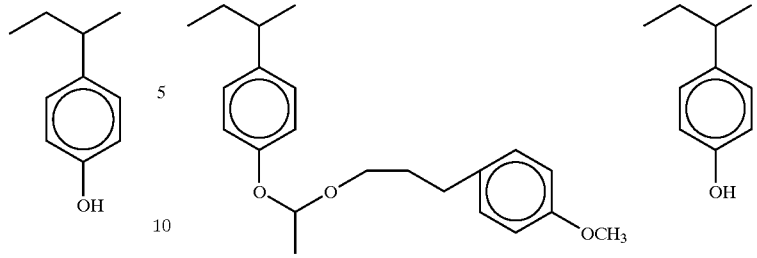
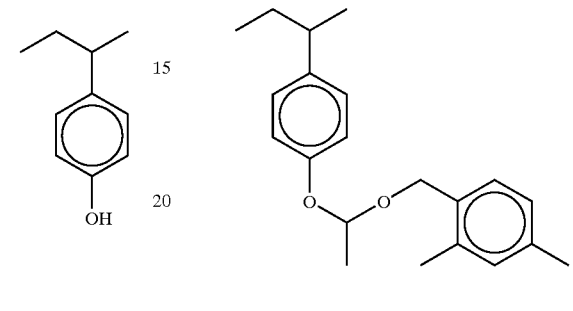
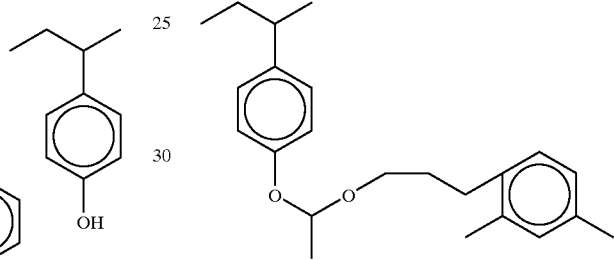
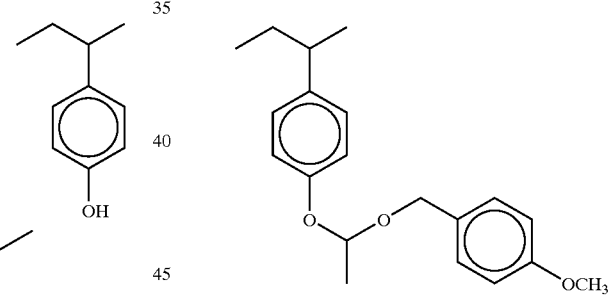
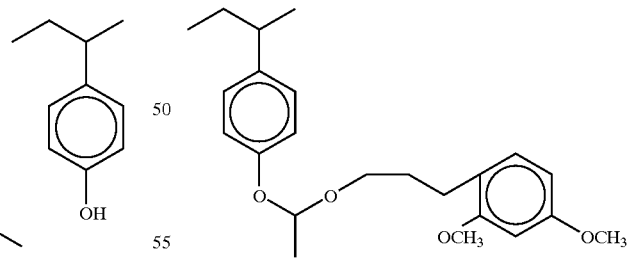
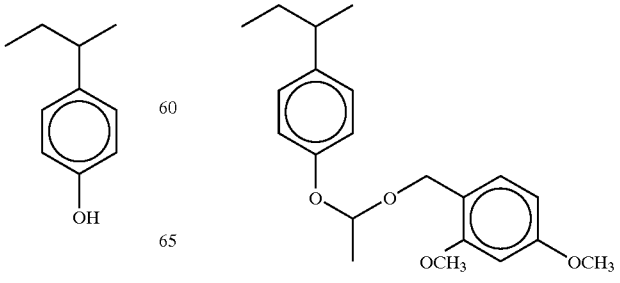

-continued

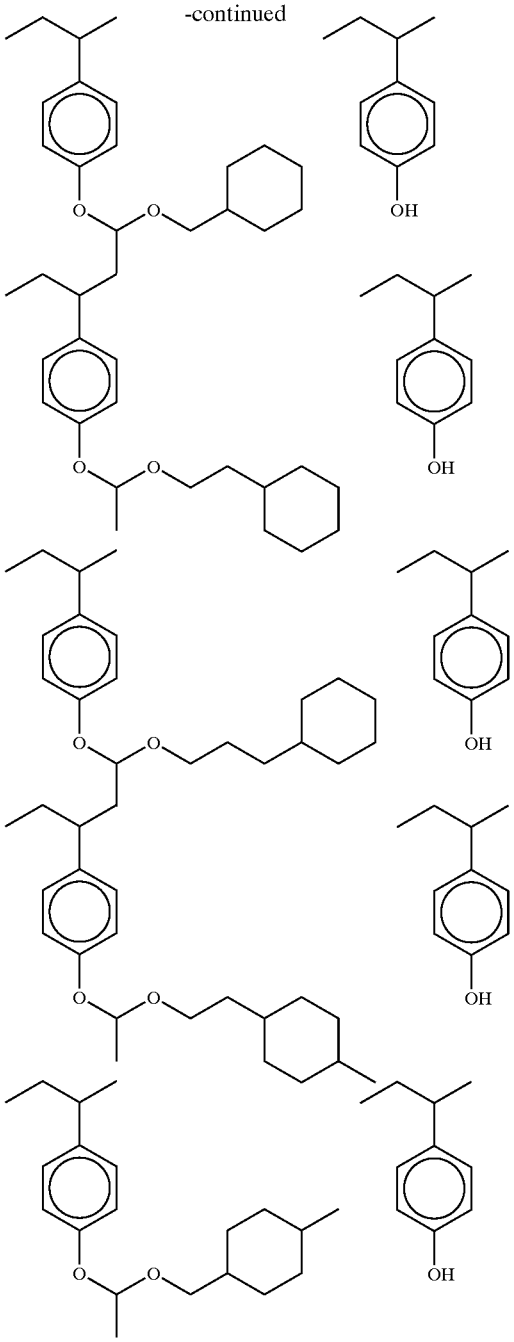

A weight average molecular weight (Mw, calculated in terms of standard polystyrene) of the resin (A) is ordinarily not less than 2,000, preferably from 3,000 to 200,000, and more preferably from 5,000 to 70,000. A dispesity (Mw/Mn) of the resin (A) is preferably from 1.0 to 4.0, more preferably from 1.0 to 3.5, and particularly preferably from 1.0 to 3.0. As the value of dispersity is small, heat resistance and image-forming properties (for example, pattern profile or defocus latitude) of the resist composition are improved.

(a-2) Resin (B), which is decomposed by the action of an acid to increase solubility in an alkali developing solution, containing a structural unit including a group represented by formula (Y) described above:

In formula (Y), $R^4$ represents an alkyl group.

The alkyl group represented by $R^4$ is preferably a straight chain or branched alkyl group having up to 4 carbon atoms, and includes, for example, methyl, ethyl, n-propyl, isopropyl, n-butyl, isobutyl, sec-butyl and tert-butyl groups.

Specific examples of the group represented by formula (Y) are set forth below, but the present invention should not be construed as being limited thereto.

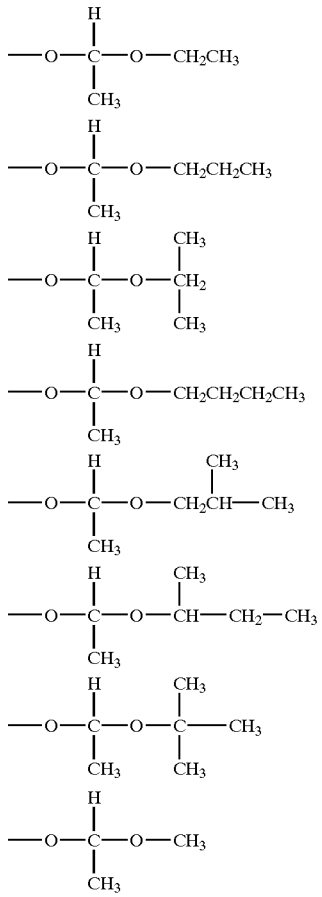

Resin (B), which is decomposed by the action of an acid to increase solubility in an alkali developing solution, containing a structural unit including a group represented by formula (Y) (hereinafter also referred to as a resin having a group represented by formula (Y)) is a compound that becomes alkali-soluble by the action of an acid and has a structure obtained by introducing an acid-decomposable group represented by formula (Y) into a compound having a molecular weight distribution obtained by polymerization of monomer.

The resin having a group represented by formula (Y) includes resins having a group represented by formula (Y) in the main chain thereof, the side chain thereof or both of the main chain and side chain thereof. Of the resins, those having a group represented by formula (Y) in the side chain thereof are more preferred.

A parent resin in the case wherein the group represented by formula (Y) is bonded as a side chain includes an alkali-soluble resin having an —OH group or a —COOH group, preferably an —R°—COOH group or an —Ar—OH group, in the side chain. In the above formulae, —R°— represents a two or higher valent aliphatic or aromatic hydrocarbon group which may have a substituent and —Ar— represents a two or higher valent monocyclic or polycyclic aromatic group which may have a substituent.

The parent resin preferably used in the present invention includes an alkali-soluble resin having a phenolic hydroxy group.

Of the alkali-soluble resins having a phenolic hydroxy group, a copolymer containing at least 30% by mole, preferably at least 50% by mole, of a repeating unit corresponding to o-, m- or p-hydroxystyrene (collectively referred to as hydroxystyrene) or o-, m- or p-hydroxy-α-methylstyrene (collectively referred to as hydroxy-α-methylstyrene), a homopolymer thereof, and such a copolymer or homopolymer wherein the benzene ring in the repeating unit described above is partially hydrogenated are preferable. p-Hydroxystyrene homopolymer is more preferred.

Monomers other than the hydroxystyrene and hydroxy-α-methylstyrene, which can be used for the preparation of copolymer, include preferably an acrylic ester, a methacrylic ester, an acrylamide, a methacrylamide, acrylonitrile, methacrylonitrile, maleic anhydride, styrene, α-methylstyrene, acetoxystyrene and an alkoxystyrene, more preferably styrene, acetoxystyrene and tert-butoxystyrene.

A content of the repeating unit (structural unit) including a group represented by formula (Y) in the resin is preferably from 5 to 70% by mole, more preferably from 5 to 50% by mole, based on the total repeating unit of the resin.

The resin including a group represented by formula (Y) according to the present invention may also contain an acid-decomposable group other than the group represented by formula (Y).

The resin including a group represented by formula (Y) can be obtained by synthesizing a corresponding vinyl ether and reacting the vinyl ether with an alkali-soluble resin having a phenolic hydroxy group dissolved in an appropriate solvent, for example, tetrahydrofuran in a conventional manner. The reaction is carried out ordinarily in the presence of an acidic catalyst, preferably an acidic ion exchange resin, hydrochloric acid, p-toluenesulfonic acid or a salt, for example, pyridinium tosylate. The corresponding vinyl ether can be synthesized, for example, by a method using a nucleophilic substitution reaction from an active starting material, e.g., chloroethyl vinyl ether or a method using a mercury or palladium catalyst.

According to another method, the vinyl ether can also be synthesized by an acetal exchange method using a corresponding alcohol and a vinyl ether. In such a case, the reaction is conducted by mixing an alcohol having the desired substituent to be introduced and a relatively unstable vinyl ether, for example, tert-butyl vinyl ether in the presence of an acidic catalyst, for example, p-toluenesulfonic acid or pyridinium tosylate.

Specific preferred examples of the structure of the resin (B) including a group represented by formula (Y) are set forth below, but the present invention should not be construed as being limited thereto.

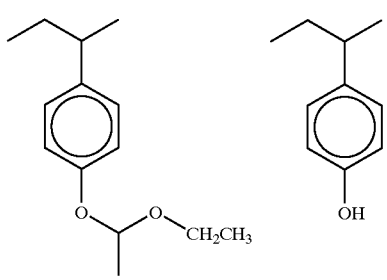

-continued

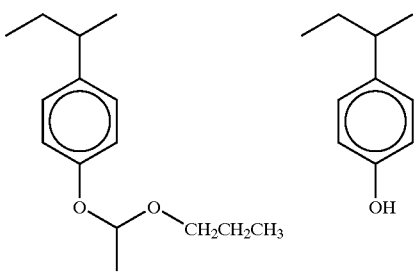

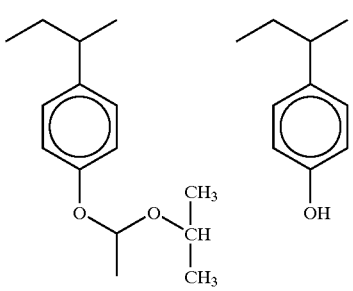

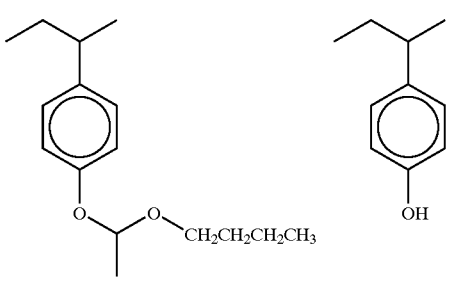

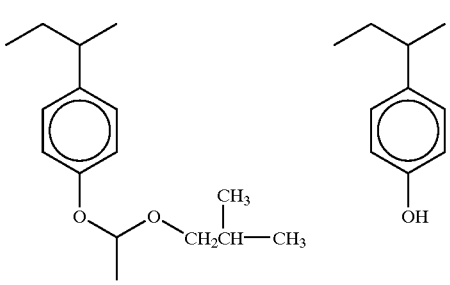

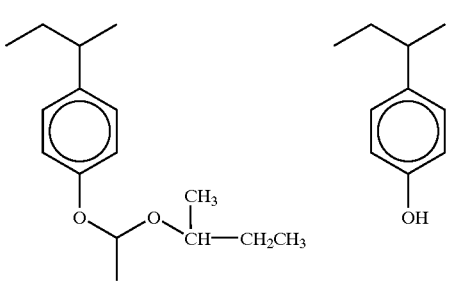

-continued

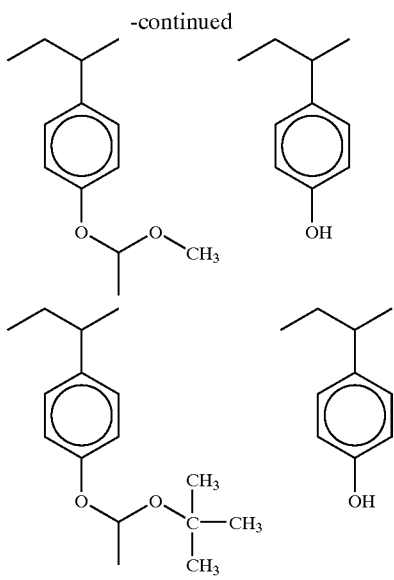

A weight average molecular weight (Mw, calculated in terms of standard polystyrene) of the resin (B) is ordinarily not less than 2,000, preferably from 3,000 to 200,000, and more preferably from 5,000 to 70,000. A dispesity (Mw/Mn) of the resin (A) is preferably from 1.0 to 4.0, more preferably from 1.0 to 3.5, and particularly preferably from 1.0 to 3.0. As the value of dispersity is small, heat resistance and image-forming properties (for example, pattern profile or defocus latitude) of the resist composition are improved.

A content of the resin (A) and/or resin (B) in the positive resist composition of the present invention is preferably from 25 to 98.998% by weight, more preferably from 40 to 95% by weight, based on the total solid content of the positive resist composition.

(a-3) Resin (C), which is decomposed by the action of an acid to increase solubility in an alkali developing solution, containing a structural unit including a group represented by formula (Q) described above:

In formula (Q), $R^5$ and $R^6$, which may be the same or different, each represent a hydrogen atom or an alkyl group, X represents an alkylene group which may have a substituent, Y represents a divalent connecting group, $Z^2$ represents a heterocyclic group which may have a substituent, and 1 represents 0 or 1.

The alkyl group represented by $R^5$ or $R^6$ in formula (Q) is preferably a straight chain or branched alkyl group having up to 4 carbon atoms, and includes, for example, methyl, ethyl, n-propyl, isopropyl, n-butyl, isobutyl, sec-butyl and tert-butyl groups. $R^5$ and $R^6$ each more preferably represent a hydrogen atom or a methyl group.

The alkylene group represented by X in formula (Q) is preferably an alkylene group having from 1 to 20 carbon atoms, more preferably an alkylene group having from 1 to 10 carbon atoms, and includes, for example, methylene, ethylene, propylene, butylene, pentylene, hexylene, heptylene, octylene, nonylene and decanylene groups. Of these groups, ethylene, propylene and butylene groups are more preferred.

The alkylene group may have a substituent, and examples of the substituent include a methyl group, an ethyl group, a propyl group, a butyl group, a phenyl group, a tolyl group and a cyclohexyl group.

A hetero ring included in the heterocyclic group represented by $Z^2$ includes, for example, thiirane, thiolane, thiophene, furan, pyrrole, benzothiophene, benzofuran, benzopyrrole, triazine, imidazole, benzimidazole, triazole, thiadiazole, thiazole and pyrrolidone. However, the hetero ring should not be construed as being limited to these rings and any ring ordinarily called as a hetero ring (including a ring formed by a carbon atom and a hetero atom and a ring formed by a hetero atom) may be used.

Examples of the substituent for the heterocyclic group represented by $Z^2$ include a hydroxy group, a halogen atom (e.g., fluorine, chlorine, bromine or iodine), a nitro group, a cyano group, an alkyl group, an alkoxy group (e.g., methoxy, ethoxy, hydroxyethoxy, propoxy, hydroxypropoxy, n-butoxy, isobutoxy, sec-butoxy or tert-butoxy), an alkoxycarbonyl group (e.g., methoxycarbonyl or ethoxycarbonyl), an aralkyl group (e.g., benzyl phenethyl or cumyl), an aralkyloxy group, an acyl group (e.g., formyl, acetyl, butyryl, benzoyl, cinnamoyl or valeryl), an acyloxy group (e.g., butyryloxy), an alkenyl group, an alkenyloxy group (e.g., vinyloxy, propenyloxy, allyoxy or butenyloxy), an aryl group, an aryloxy group (e.g., phenyloxy) and an aryloxycarbonyl group (e.g., phenyloxycarbonyl).

The divalent connecting group represented by Y includes —O—C(=O)—, —O—, —S—, —SO$_2$—, —SO—, —Se— and an alkylene group having from 1 to 4 carbon atoms. The divalent groups may be used individually or in combination of two or more thereof.

Preferred examples of the divalent connecting group represented by Y includes —O—C(=O)—, —O—, —S—, —SO$_2$—, —Se— and —O—C(=O)—CH$_2$—.

Specific examples of the group represented by formula (Q) are set forth below, but the present invention should not be construed as being limited thereto.

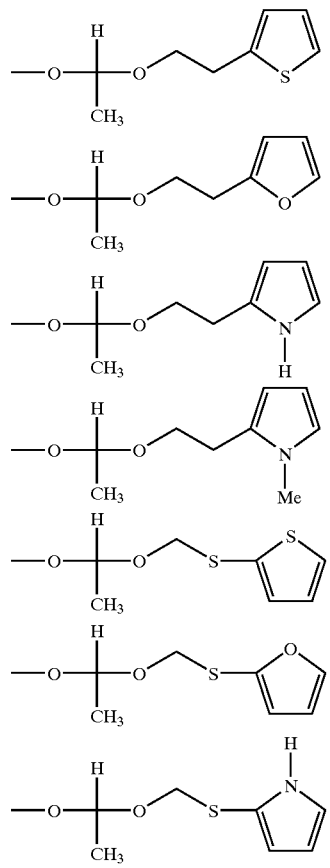

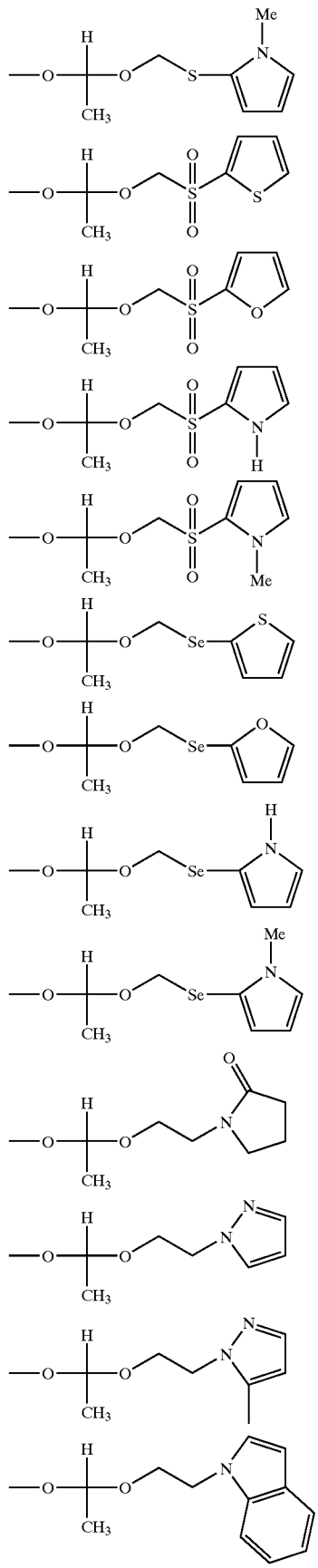
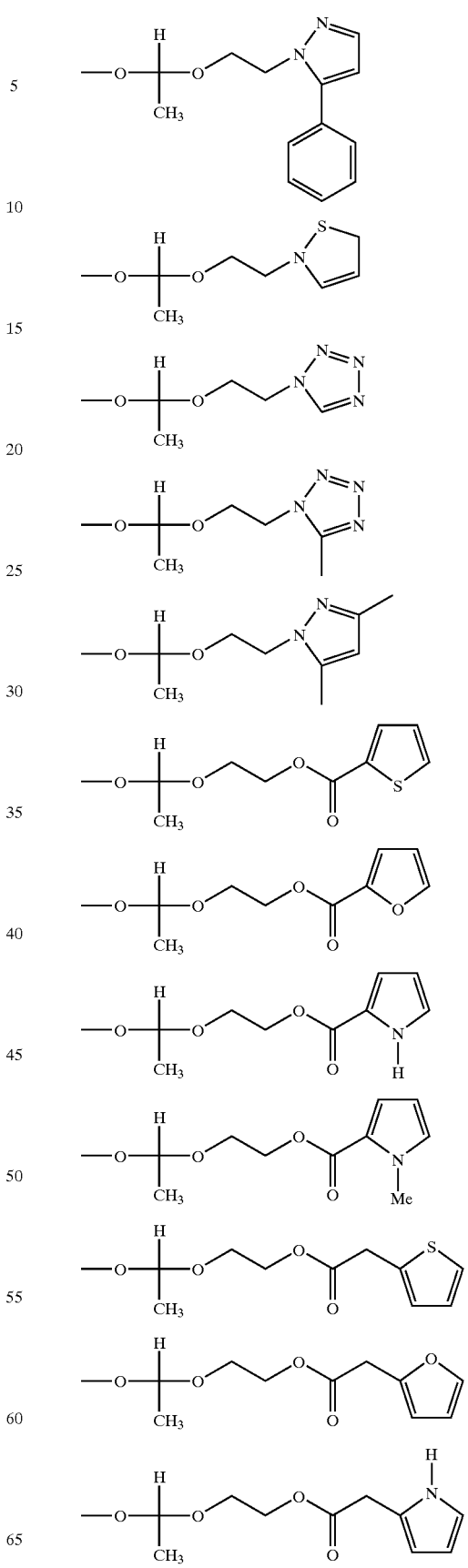

-continued

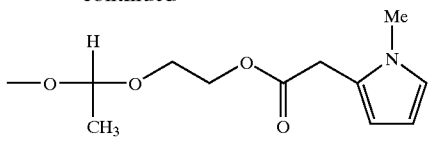

Resin (C), which is decomposed by the action of an acid to increase solubility in an alkali developing solution, containing a structural unit including a group represented by formula (Q) is a compound that becomes alkali-soluble by the action of an acid and has a structure obtained by introducing an acid-decomposable group represented by formula (Q) into a compound having a molecular weight distribution obtained by polymerization of monomer.

The resin (C) includes resins having a group represented by formula (Q) in the main chain thereof, the side chain thereof or both of the main chain and side chain thereof. Of the resins, those having a group represented by formula (Q) in the side chain thereof are more preferred.

A parent resin in the case wherein the group represented by formula (Q) is bonded as a side chain includes an alkali-soluble resin having an —OH group or a —COOH group, preferably an —R⁰—COOH group or an —Ar—OH group, in the side chain. In the above formulae, —R⁰— represents a two or higher valent aliphatic or aromatic hydrocarbon group which may have a substituent and —Ar— represents a two or higher valent monocyclic or polycyclic aromatic group which may have a substituent.

The parent resin preferably used in the present invention includes an alkali-soluble resin having a phenolic hydroxy group.

Of the alkali-soluble resins having a phenolic hydroxy group, a copolymer containing at least 30% by mole, preferably at least 50% by mole, of a repeating unit corresponding to o-, m- or p-hydroxystyrene (collectively referred to as hydroxystyrene) or o-, m- or p-hydroxy-α-methylstyrene (collectively referred to as hydroxy-α-methylstyrene), a homopolymer thereof, and such a copolymer or homopolymer wherein the benzene ring in the repeating unit described above is partially hydrogenated are preferable. p-Hydroxystyrene homopolymer is more preferred.

Monomers other than the hydroxystyrene and hydroxy-α-methylstyrene, which can be used for the preparation of copolymer, include preferably an acrylic ester, a methacrylic ester, an acrylamide, a methacrylamide, acrylonitrile, methacrylonitrile, maleic anhydride, styrene, α-methylstyrene, acetoxystyrene and an alkoxystyrene, more preferably styrene, acetoxystyrene and tert-butoxystyrene.

A content of the repeating unit (structural unit) including a group represented by formula (Q) in the resin is preferably from 5 to 50% by mole, more preferably from 5 to 40% by mole, based on the total repeating unit of the resin.

The resin including a group represented by formula (Q) according to the present invention, which is a polymeric dissolution inhibiting compound, may also contain an acid-decomposable group other than the group represented by formula (Q).

The resin (C) including the group represented by formula (Q) can be obtained by synthesizing a corresponding vinyl ether and reacting the vinyl ether with an alkali-soluble resin having a phenolic hydroxy group dissolved in an appropriate solvent, for example, tetrahydrofuran in a conventional manner. The reaction is carried out ordinarily in the presence of an acidic catalyst, preferably an acidic ion exchange resin, hydrochloric acid, p-toluenesulfonic acid or a salt, for example, pyridinium tosylate.

A weight average molecular weight (Mw, calculated in terms of standard polystyrene) of the resin (C) including the group represented by formula (Q) is preferably from 3,000 to 80,000, and more preferably from 7,000 to 50,000. A dispersity (Mw/Mn) of the resin (C) is ordinarily from 1.01 to 4.0, and preferably from 1.05 to 3.00. In order to obtain the polymer having such a dispersity, an anion polymerization method or a radical polymerization method is preferably employed.

Specific preferred examples of the structure of the resin (C) including a group represented by formula (Q) are set forth below, but the present invention should not be construed as being limited thereto.

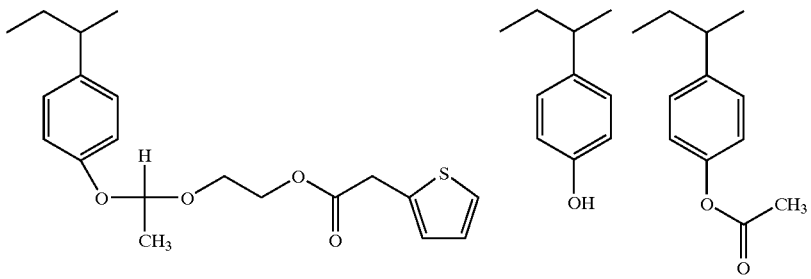

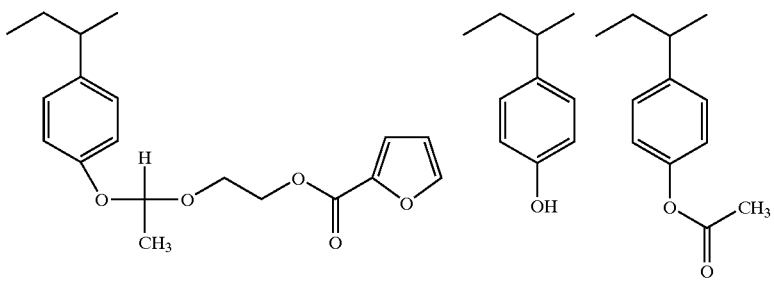

-continued
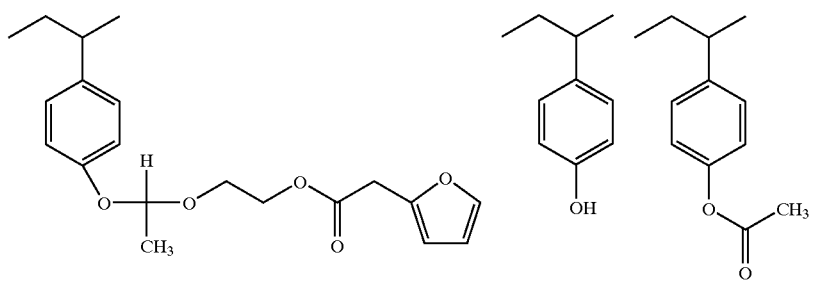
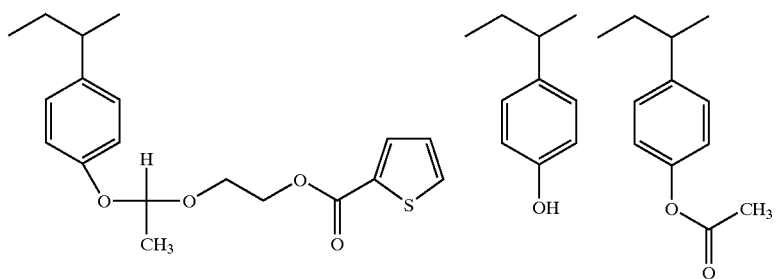
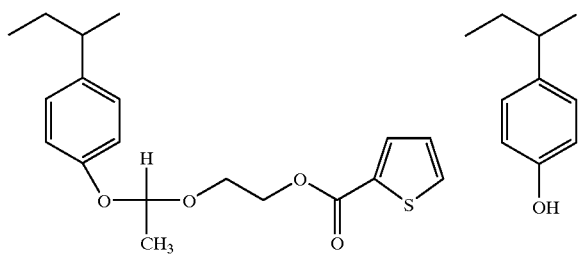
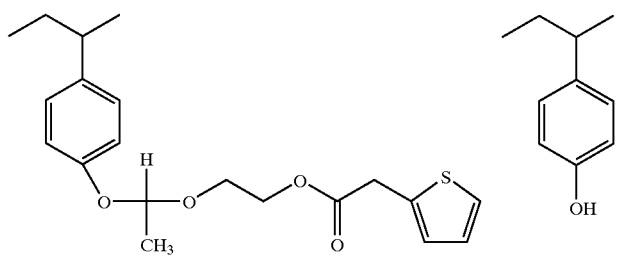
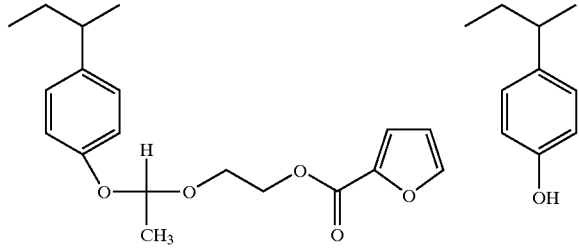
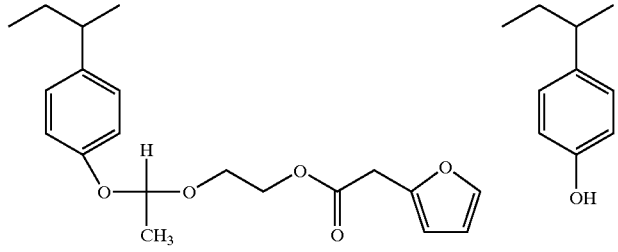

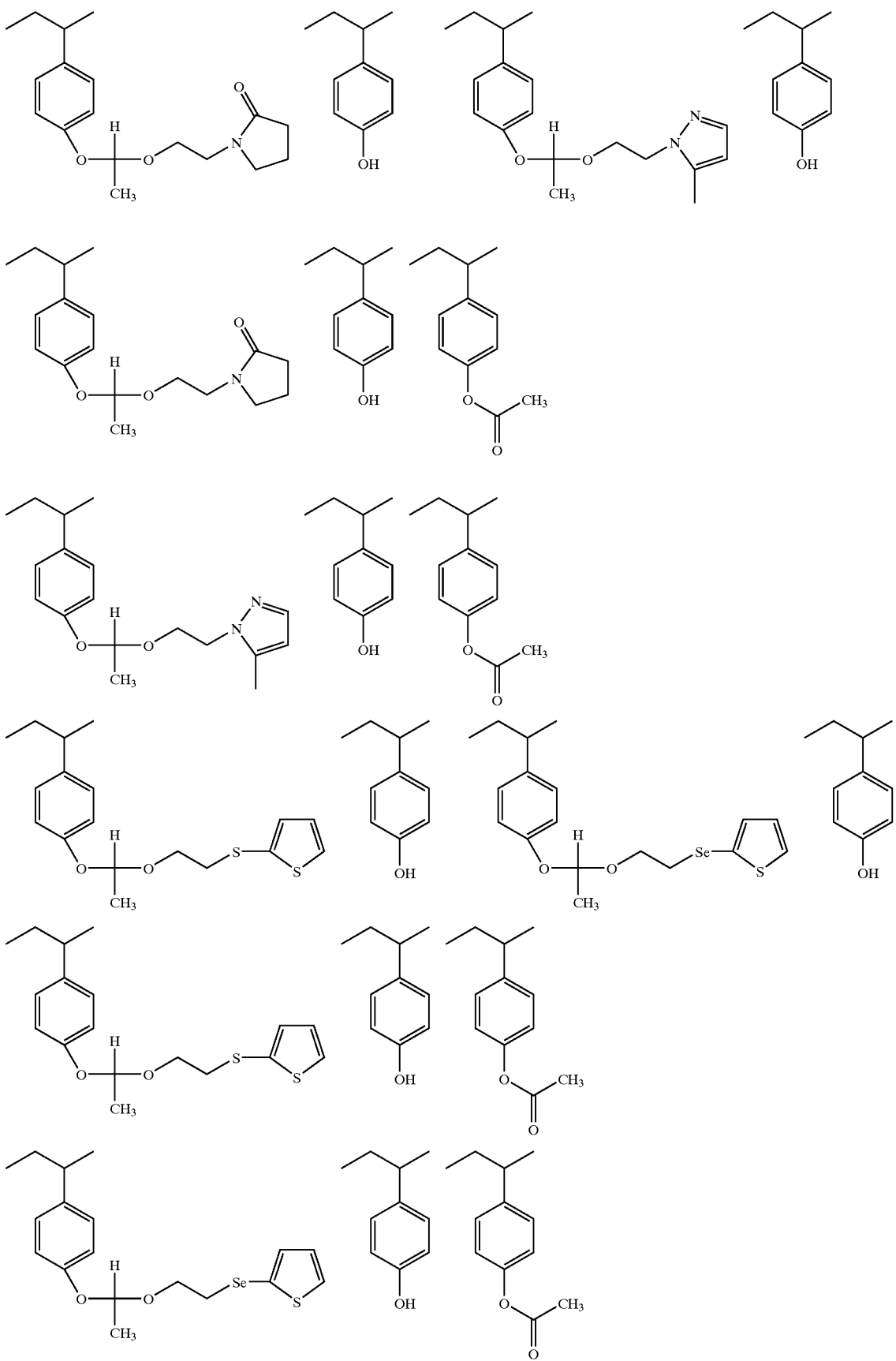

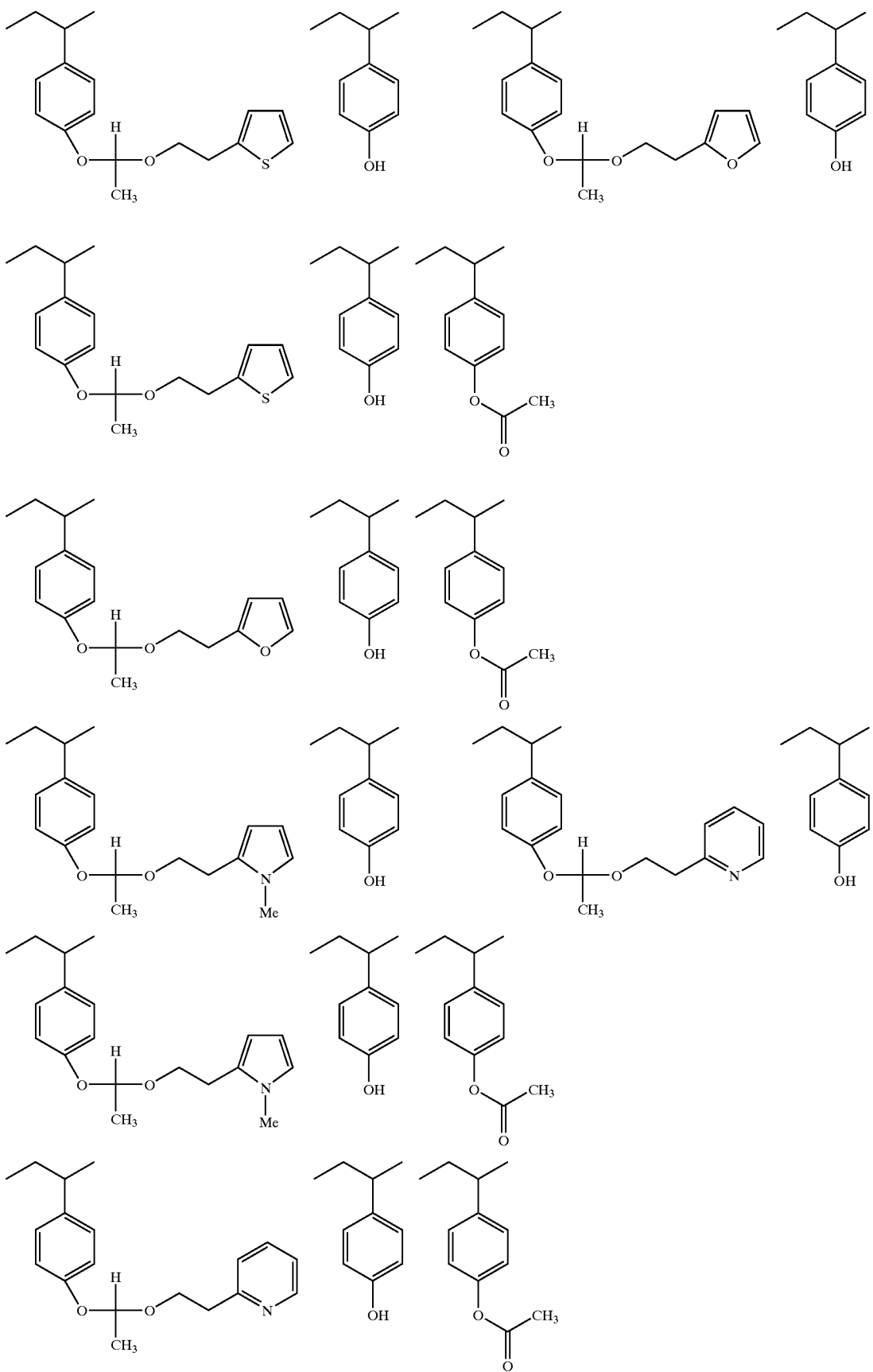

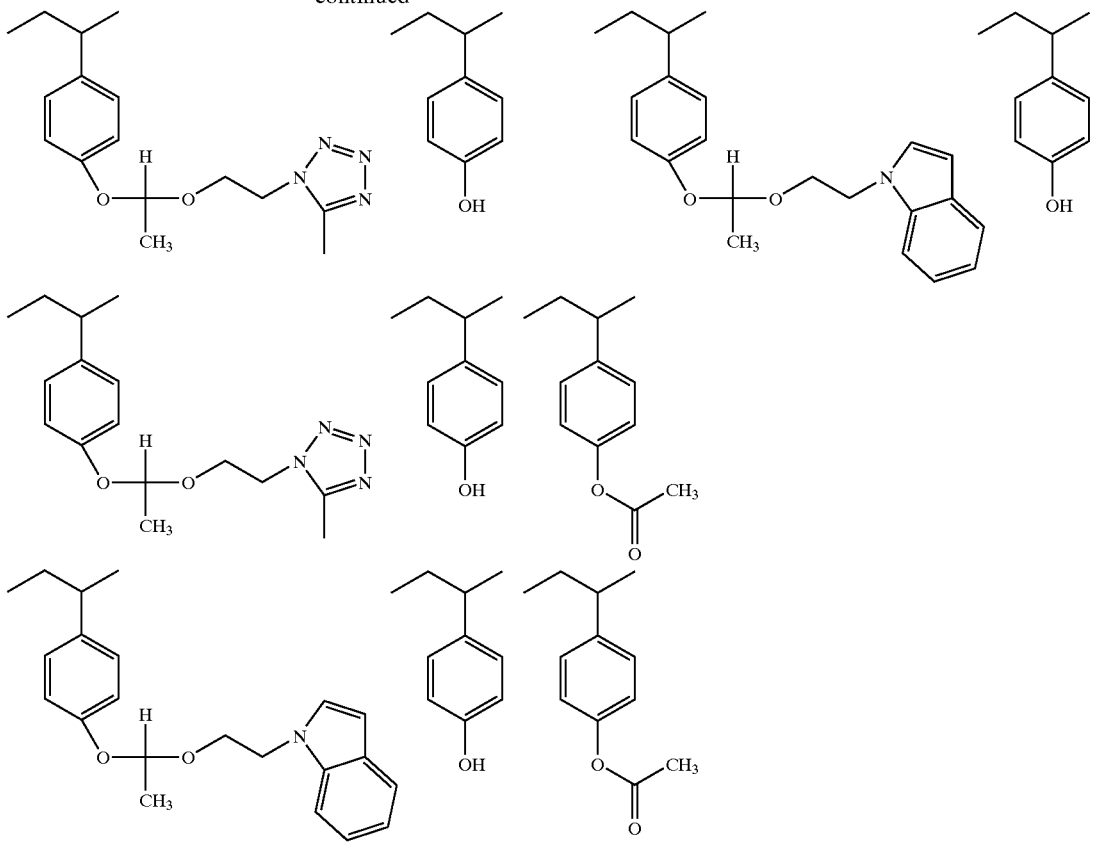

A content of the resin (C) in the positive resist composition of the present invention is preferably from 1.0 to 70% by weight, more preferably from 5.0 to 50% by weight, based on the total solid content of the positive resist composition.

(b) Compound that generates an acid upon irradiation of an actinic ray or radiation (hereinafter, also referred to as an "photo-acid generator"):

The photo-acid generator of component (b) for use in the present invention is a compound that generates an acid upon irradiation of an actinic ray or radiation.

The photo-acid generator for use in the present invention can be appropriately selected from photo-initiators for photo-cationic polymerization, photoinitiators for photo-radical polymerization, photo-achromatic agents for dyes, photo-discoloring agents, compounds generating an acid upon irradiation of known light used for a microresist (an ultraviolet ray or far ultraviolet ray of from 400 to 200 nm, particularly preferably, a g-line, h-line, i-line or KrF excimer laser beam), an ArF excimer laser beam, an electron beam, an X ray, a molecular beam or an ion beam, and mixtures thereof.

Examples of such photo-acid generators include an onium salt, for example, a diazonium salt, an ammonium salt, a phosphonium salt, an iodonium salt, a sulfonium salt, a selenonium salt or an arsonium salt, an organic halogen compound, an organic metal/organic halide compound, a photo-acid generator having an o-nitrobenzyl type protective group, a compound generating a sulfonic acid upon photolysis, which is represented by an iminosulfonate, a disulfone compound, a diazoketosulfone compound and a diazodisulfone compound.

Also, polymer compounds in which a group or compound generating an acid upon irradiation of an actinic ray or radiation is introduced into the main chain or side chain thereof may be used.

Further, compounds generating an acid with light as described, for example, in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may be used.

Of the photo-acid generators, those which can be particularly effectively used in the present invention are described below.

(1) Oxazole derivative substituted with a trihalomethyl group represented by formula (PAG1) shown below or S-triazine derivative substituted with a trihalomethyl group represented by formula (PAG2) shown below:

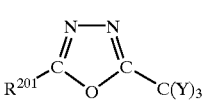
(PAG1)

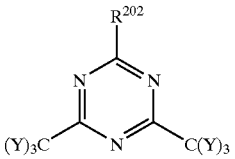
(PAG2)

In formulae (PAG1) and (PAG2), $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group or —C(Y)$_3$; and Y represents a chlorine atom or a bromine atom.
Specific examples of such compounds are set forth below, but the present invention should not be construed as being limited thereto.
(PAG1-1)
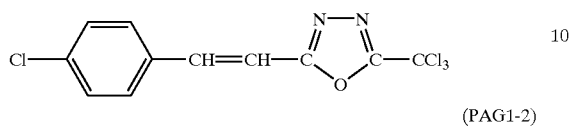
(PAG1-2)
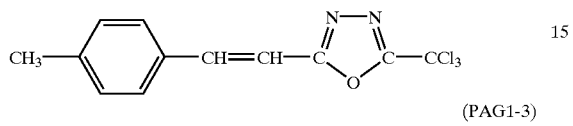
(PAG1-3)
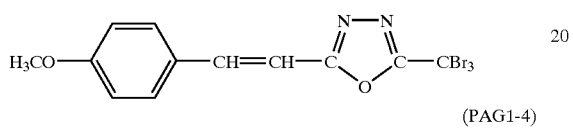
(PAG1-4)
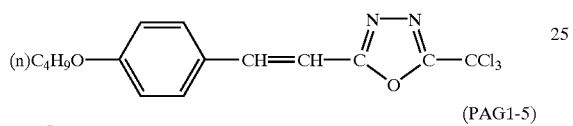
(PAG1-5)
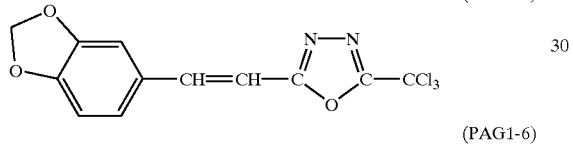
(PAG1-6)
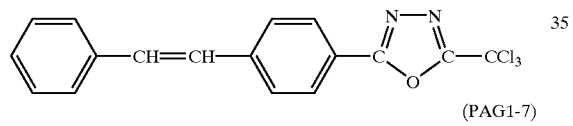
(PAG1-7)
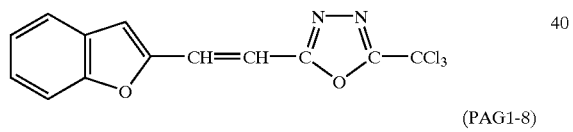
(PAG1-8)
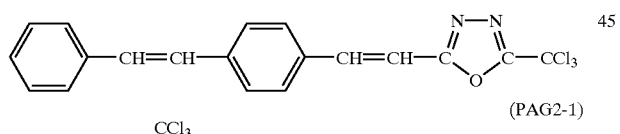
(PAG2-1)
(PAG2-2)
-continued
(PAG2-3)
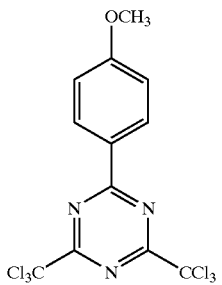
(PAG2-4)
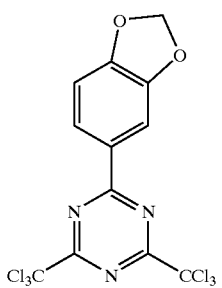
(PAG2-5)
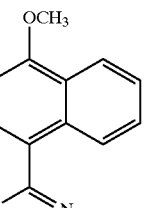
(PAG2-6)
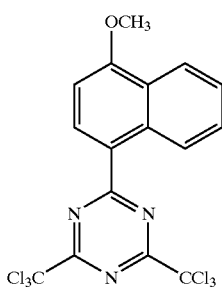
(PAG2-7)
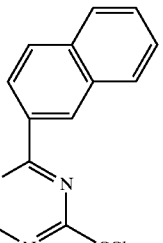

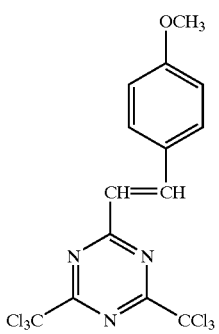
(PAG2-8)

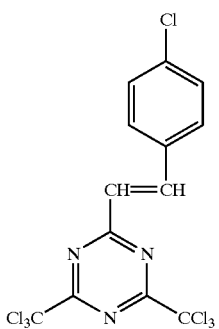
(PAG2-9)

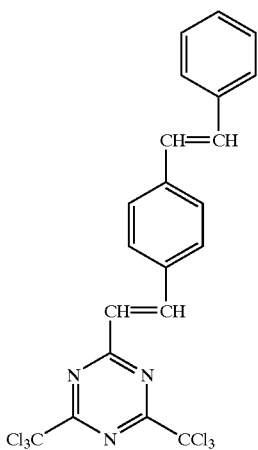
(PAG2-10)

(2) Iodonium salt represented by formula (PAG3) shown below or sulfonium salt represented by formula (PAG4) shown below:

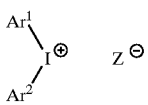
(PAG3)

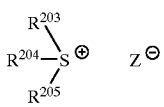
(PAG4)

In formulae (PAG3) and (PAG4), $Ar^1$ and $Ar^2$, which may be the same or different, each independently represent a substituted or unsubstituted aryl group.

$R^{203}$, $R^{204}$ and $R^{205}$, which may be the same or different, each independently represents a substituted or unsubstituted alkyl group or a substituted or unsubstituted aryl group.

$Z^-$ represents a counter anion. Examples of the counter anion include $BF_4^-$, $AsF_6^-$, $PF_6^-$, $SbF_6^-$, $SiF_6^{2-}$, $ClO_4^-$, a perfluoroalkane sulfonic acid anion, e.g., $CF_3SO_3^-$, an alkyl-sulfonic acid anion, e.g., camphorsulfonic acid anion, an aromatic sulfonic anion, e.g., pentafluorobenzenesulfonic acid anion, benzenesulfonic acid anion or triisopropylbenzenesulfonic acid anion, a condensed polynuclear aromatic sulfonic anion, e.g., naphthalene-1-sulfonic acid anion, an anthraquinone sulfonic acid anion and a dye containing a sulfonic acid group, however, the present invention should not be construed as being limited thereto. The anion moiety may further has a substituent.

Two of $R^{203}$, $R^{204}$ and $R^{205}$ or $Ar^1$ and $Ar^2$ may be combined with each other through a single bond or a substituent.

Specific examples of such compounds are set forth below, but the present invention should not be construed as being limited thereto.

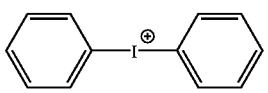
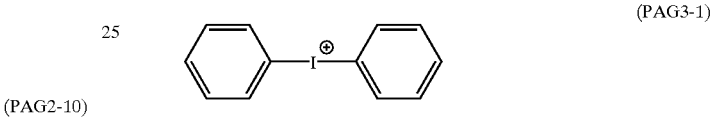
(PAG3-1)

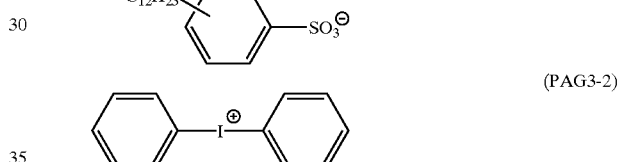
(PAG3-2)

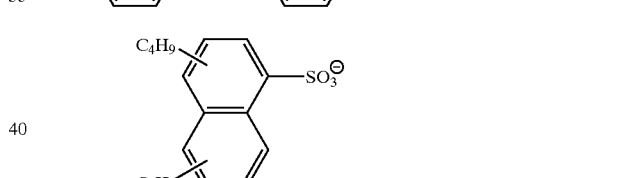
(PAG3-3)

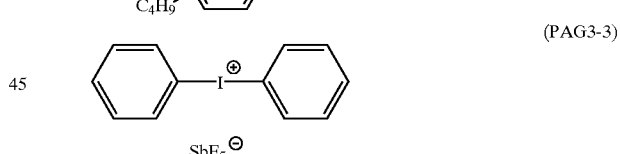
(PAG3-4)

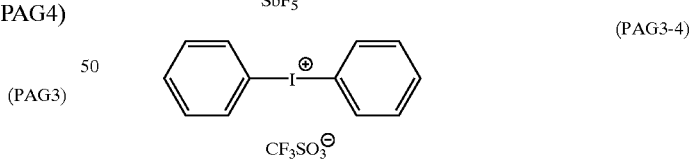
(PAG3-5)

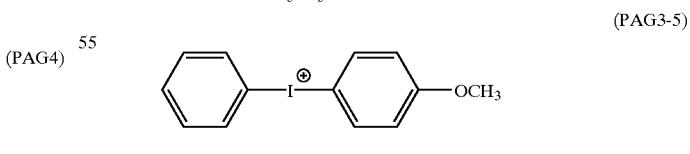

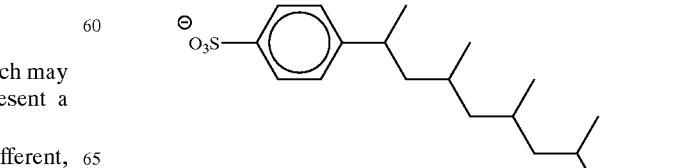

-continued
(PAG3-6)
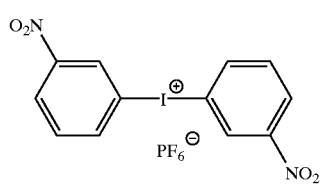
(PAG3-7)
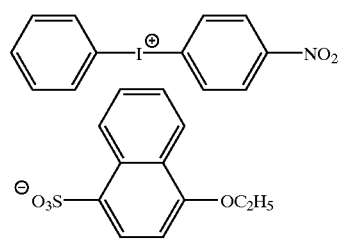
(PAG3-8)
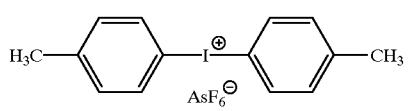
(PAG3-9)
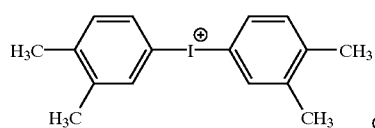
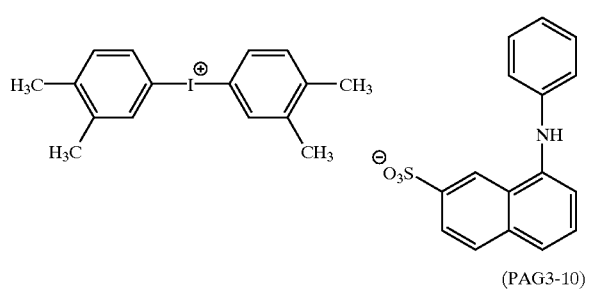
(PAG3-10)
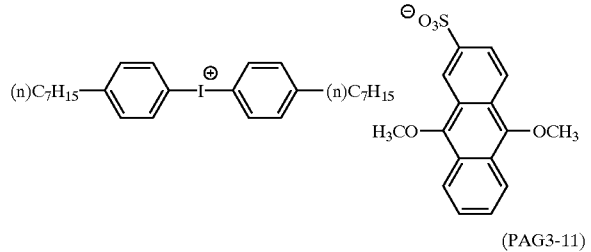
(PAG3-11)
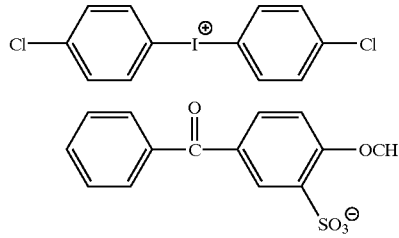
(PAG3-12)
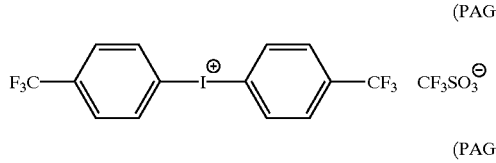
(PAG3-13)
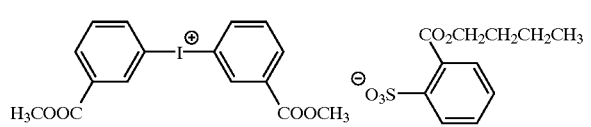
-continued
(PAG3-14)
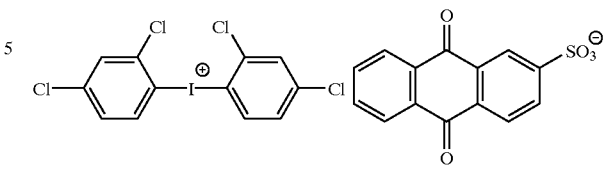
(PAG3-15)
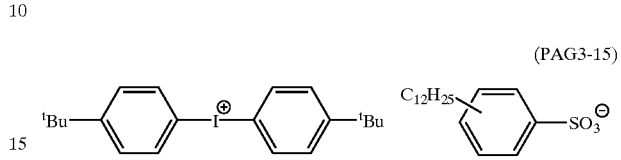
(PAG3-16)
(PAG3-17)
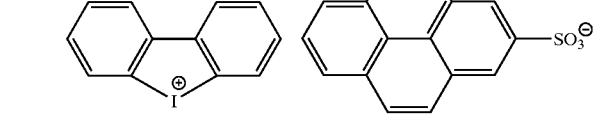
(PAG3-18)
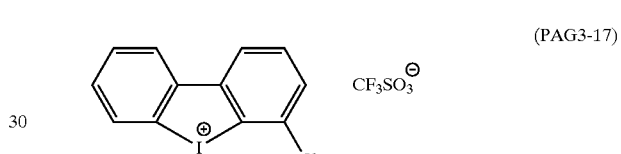
(PAG3-19)
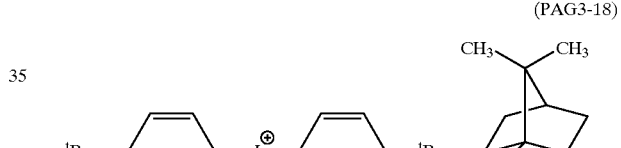
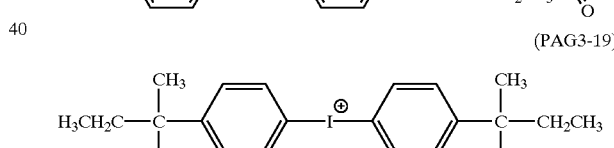
(PAG3-20)
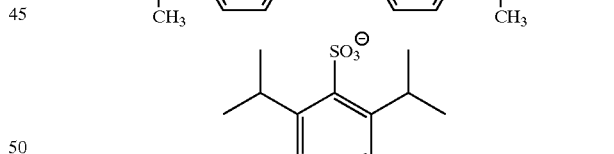
(PAG3-21)
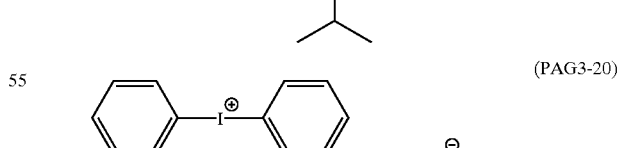
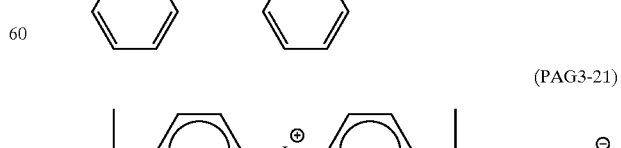

(PAG3-22)
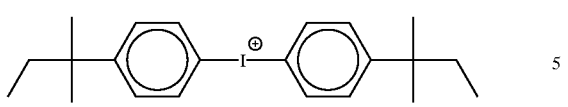
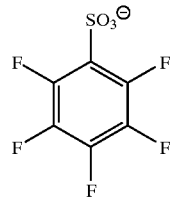
(PAG3-23)
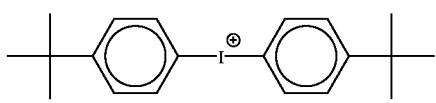
(PAG3-24)
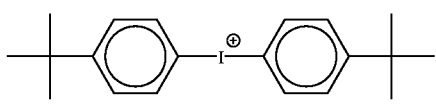
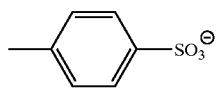
(PAG3-25)
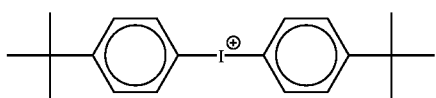
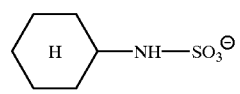
(PAG4-1)
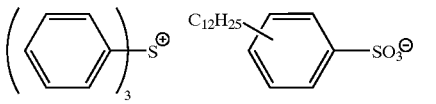
(PAG4-2)
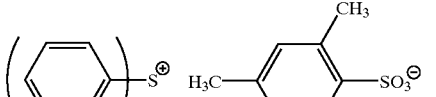
(PAG4-3)
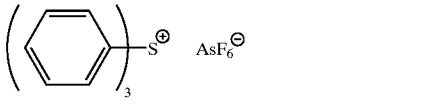
(PAG4-4)
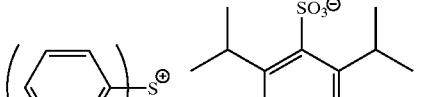
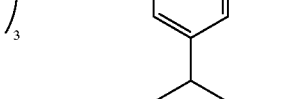
(PAG4-5)
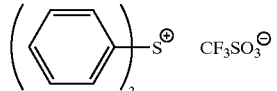
(PAG4-6)
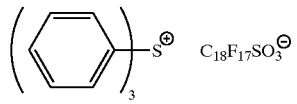
(PAG4-7)
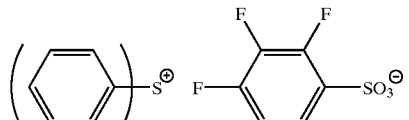
(PAG4-8)
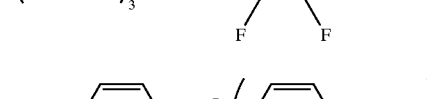
(PAG4-9)
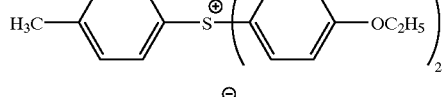
(PAG4-10)
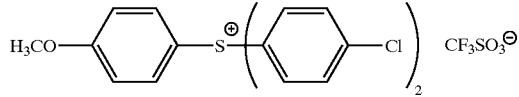
(PAG4-11)
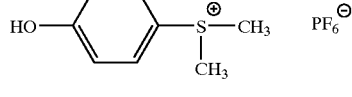
(PAG4-12)
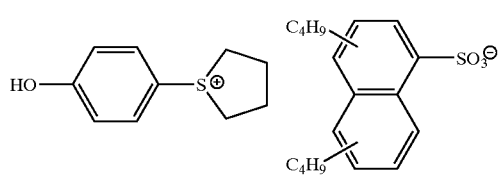
(PAG4-13)
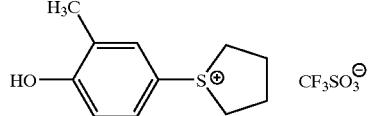
(PAG4-14)

(PAG4-15)
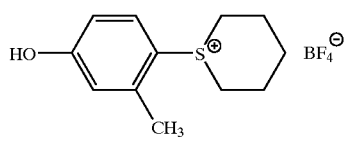
(PAG4-16)
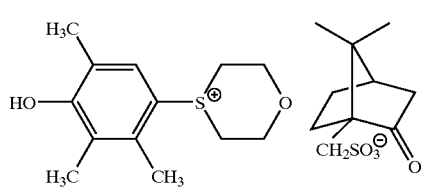
(PAG4-17)
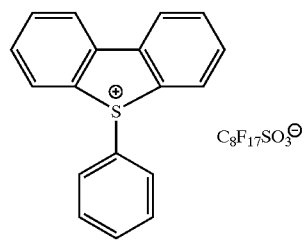
(PAG4-18)
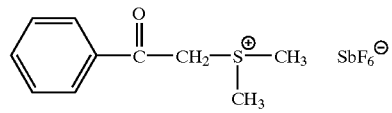
(PAG4-19)
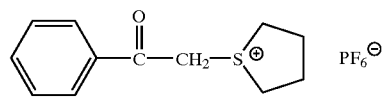
(PAG4-20)
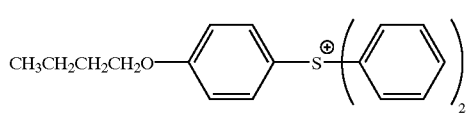
(PAG4-21)
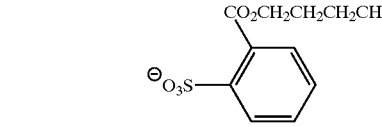
(PAG4-22)
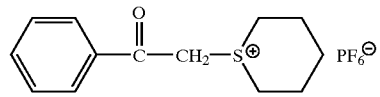
(PAG4-23)
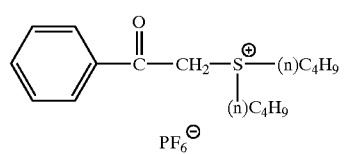
(PAG4-24)
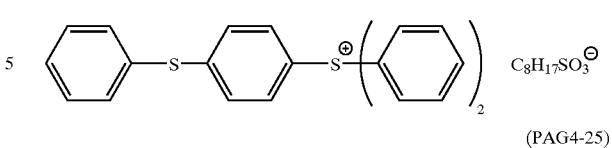
(PAG4-25)
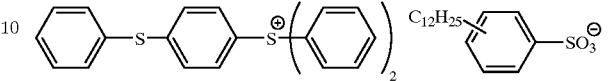
(PAG4-26)
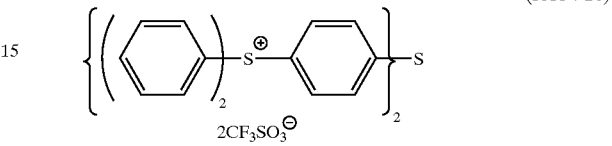
(PAG4-27)
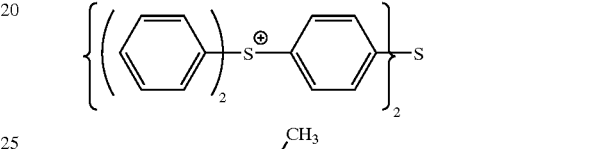
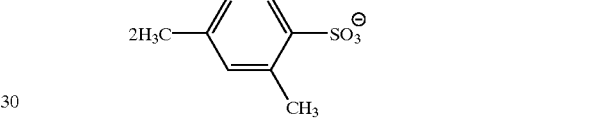
(PAG4-28)
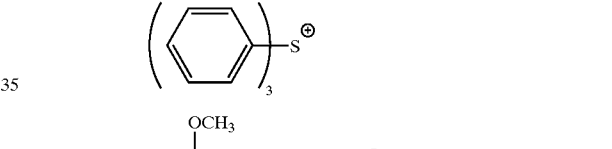
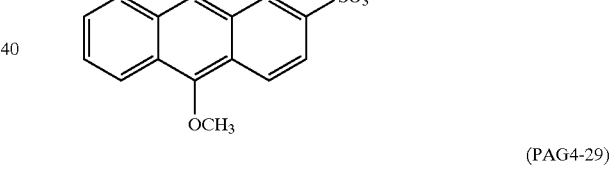
(PAG4-29)
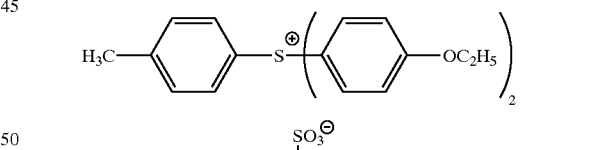
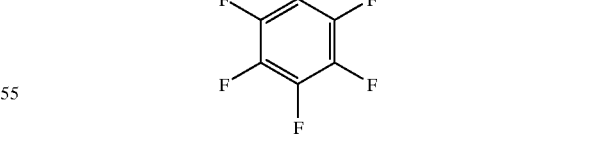
(PAG4-30)
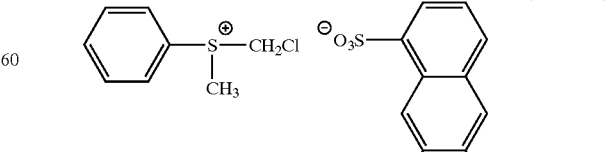

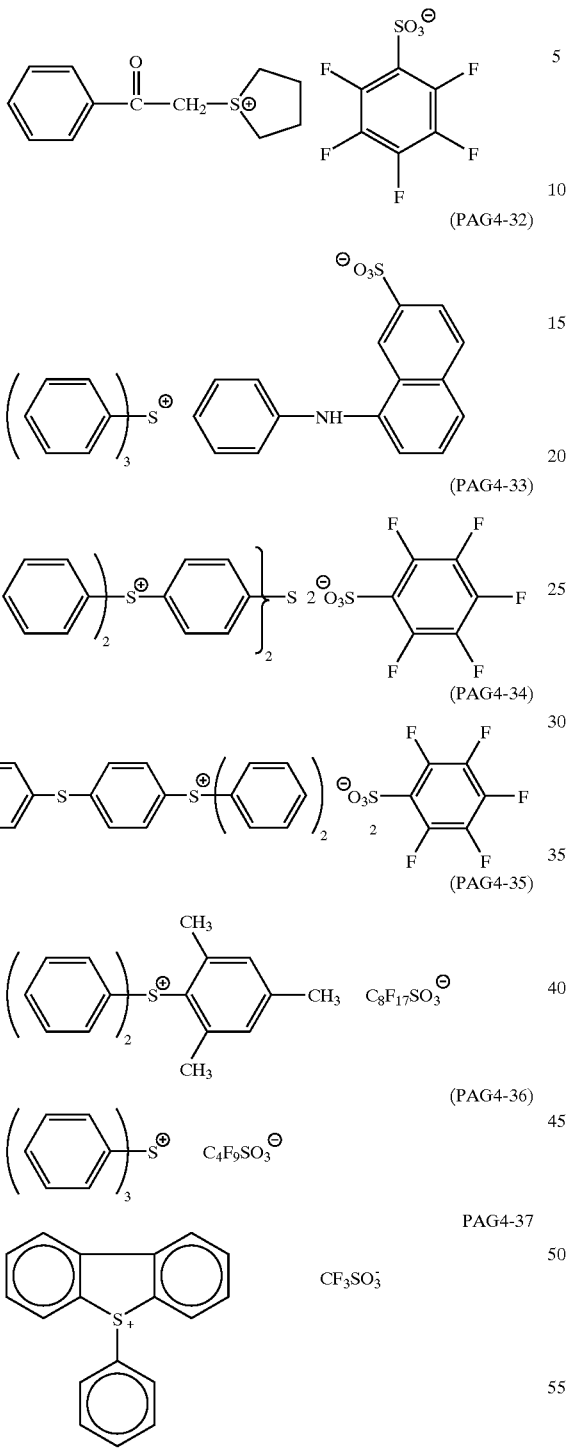

and JP-A-53-101331 (the term "JP-A" as used herein means an "unexamined published Japanese patent application").

(3) Disulfone derivative represented by formula (PAG5) shown below or iminosulfonate derivative represented by formula (PAG6) shown below:

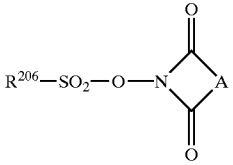

In formulae (PAG5) and (PAG6), $Ar^3$ and $Ar^4$ which may be the same or different, each independently represent a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples of such compounds are set forth below, but the present invention should not be construed as being limited thereto.

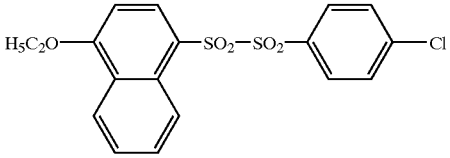

The onium salts represented by formulae (PAG3) and (PAG4) are known and can be synthesized by methods described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473

-continued (PAG5-8) (PAG6-3) (PAG5-9) (PAG6-4) (PAG5-10) (PAG6-5) (PAG5-11) (PAG6-6) (PAG5-12) (PAG6-7) (PAG5-13) (PAG6-8) (PAG5-14) (PAG6-9) (PAG5-15) (PAG6-1) (PAG6-2) (PAG6-10)

(4) Diazodisulfone derivative represented by formula (PAG7) shown below:

In formula (PAG7), R represents a straight chain, branched or cyclic alkyl group or a substituted or unsubstituted aryl group.

Specific examples of such compounds are set forth below, but the present invention should not be construed as being limited thereto.

The compound that generates an acid upon irradiation of an actinic ray or radiation of component (b) is preferably at least one of a compound having a sulfonium salt structure and a compound having a diazosulfone structure, and more preferably a combination of the compound having a sulfonium salt structure and the compound having a diazosulfone structure, because the effects of the present invention are more remarkably achieved.

An amount of the photo-acid generator added is ordinarily from 0.001 to 40% by weight, preferably from 0.01 to 20% by weight, and more preferably from 0.1 to 5% by weight, based on the total solid content of the positive resist composition. When the amount of photo-acid generator added is less than 0.001% by weight, the photospeed may remain low. On the other hand, it is not preferred that the amount of photo-acid generator added is more than 40% by weight, because light absorption of the resist composition excessively increases to cause degradation of profile and narrowing of process margin (particularly, narrowing of bake margin).

The positive resist composition of the present invention may contain an organic basic compound. It is preferred to add the organic basic compound to the positive resist composition, because stability of the resist composition during preservation is improved and the variation of linewidth due to PED is more suppressed.

The organic basic compound preferably used in the present invention is a compound having basicity higher than phenol. Among others, nitrogen-containing basic compounds are preferred.

Preferred chemical circumstance includes a structure represented by any one of the following formulae (A) to (E):

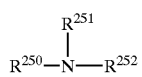
(A)

In the above formula, $R^{250}$, $R^{251}$ and $R^{252}$ which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may be combined with each other to form a ring,

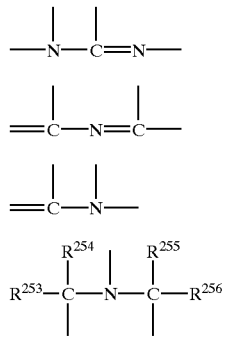

In the above formulae, $R^{253}$, $R^{254}$, $R^{255}$ and $R^{256}$, which may be the same or different, each represent an alkyl group having from 1 to 6 carbon atoms.

More preferred organic basic compounds are nitrogen-containing cyclic compounds (also referred to as a cyclic amine compound) and nitrogen-containing basic compounds having two or more nitrogen atoms having different chemical circumstances per molecule.

The cyclic amine compound preferably has a polycyclic structure. Specific preferred examples of the cyclic amine compound include compounds represented by the following formula (F):

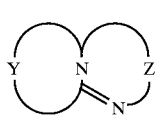
(F)

In formula (F), Y and Z, which may be the same or different, each independently represent a straight chain, branched or cyclic alkylene group, which may contain a hetero atom or may be substituted.

Examples of the hetero atom includes a nitrogen atom, a sulfur atom and an oxygen atom. The alkylene group preferably has from 2 to 10 carbon atoms, and more preferably from 2 to 5 carbon atoms. Examples of the substituent for the alkylene group include an alkyl group having from 1 to 6 carbon atoms, an aryl group, an alkenyl group, a halogen atom and a halogen-substituted alkyl group. Specific examples of the compound represented by formula (F) are set forth below.

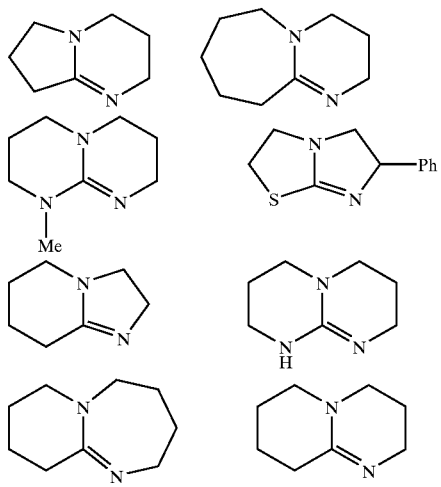

Of the cyclic amine compound represented by formula (F), 1,8-diazabicyclo[5.4.0]undec-7-ene and 1,5-diazabicyclo[4.3.0]non-5-ene are particularly preferred.

Of the nitrogen-containing basic compounds having two or more nitrogen atoms of different chemical circumstances per molecule, those particularly preferred include compounds containing both a substituted or unsubstituted amino group and a cyclic structure including a nitrogen atom and compounds having an alkylamino group. Preferred specific examples thereof include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Preferred specific examples thereof include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole and methyldiphenylimidazole. However, the nitrogen-containing basic compounds for use in the present invention should not be construed as being limited thereto.

The organic basic compounds may be used individually or as a mixture of two or more thereof. An amount of the organic basic compound used is ordinarily from 0.001 to 10 parts by weight, preferably from 0.01 to 5 parts by weight, based on 100 parts by weight of the positive resist composition (excluding a solvent) of the present invention. When the amount is less than 0.001 parts by weight, an effect of the addition of organic basic compound is not obtained. When the amount exceeds 10 parts by weight, on the other hand, the sensitivity tends to decrease or the developability tends to degrade in the unexposed area.

Into the chemically amplified positive resist composition of the present invention, other additives, for example, a surface active agent, a dye, a pigment, a plasticizer, a photosensitizer or a compound promoting dissolution in a developing solution, which has at least two phenolic hydroxy groups, may be incorporated.

The positive resist composition of the present invention preferably contains a surface active agent. Specific examples of the surface active agent include a nonionic surface active agent, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate, or a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate, a fluorine-based surface active agent, for example, Eftop EF301, EF303 and EF352 (manufactured by Shin-Akita Kasei Co., Ltd.), Megafac F171, F173, F176, F189 and R08 (manufactured by Dainippon Ink and Chemicals, Inc.), Fluorad FC430 and FC431 (manufactured by Sumitomo 3M Ltd.) or Asahiguard AG710, Surflon S-382, SC101, SC102, SC103, SC104, SC105 and SC106 (manufactured by Asahi Glass Co., Ltd.), an organosiloxane polymer KP-341 (manufactured by Shin-Etsu Chemical Co., Ltd.), an acrylic acid or methacrylic acid (co)polymer (Polyflow No. 75 and No. 95 (manufactured by Kyoeisha Chemical Co., Ltd.) and Troysol S-366 (manufactured by Troy Chemical Corp.).

Of the surface active agents, a fluorine-based or silicon-based surface active agent is preferably used in view of good coating ability and reduced development defect.

An amount of the surface active agent added is ordinarily from 0.01 to 2% by weight, preferably from 0.01 to 1% by weight, based on the total solid content of the positive resist composition of the present invention. The surface active agents may be used individually or in combination of two or more thereof.

It is possible for the chemically amplified positive resist composition of the present invention to have sensitivity to an i-line or g-line by adding a spectral sensitizer shown below thereto so as to be sensitized in a wavelength region longer than far ultraviolet, in which the photo-acid generator used does not have absorption. Preferred examples of the spectral sensitizer include specifically benzophenone, p,p'-tetramethyldiaminobenzophenone, p,p'-tetraethyldiaminobenzophenone, 2-chlorothioxanthone, anthrone, 9-ethoxyanthracene, anthracene, pyrene, perylene, phenothiazine, benzil, Acridine Orange, Benzoflavin, Setoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone 1,2-naphthoquinone, 3,3'-carbonylbis(5,7-dimethoxycarbonylcoumarin) and coronene. However, the spectral sensitizer used in the present invention should not be construed as being limited thereto.

The compound promoting dissolution in a developing solution, which has at least two phenolic hydroxy groups, include a polyhydroxy compound. Preferred examples of the polyhydroxy compound include a phenol, resorcin, phloroglucine, phloroglucide, 2,3,4-trihydroxybenzophenone, 2,3,4,4'-tetrahydroxybenzophenone, α-,α'-,α"-tris(4-hydroxyphenyl)-1,3,5-triisopropylbenzene, tris(4-hydroxyphenyl)methane, tris(4-hydroxyphenyl)ethane and 1,1'-bis(4-hydroxyphenyl)cyclohexane.

The chemically amplified positive resist composition of the present invention is used by dissolving the above-described components in a solvent, which can dissolve the components, and coating the resulting solution on a substrate. Preferred examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone and tetrahydrofuran. The solvents may be used individually or as a mixture of two or more thereof.

The chemically amplified positive resist composition is applied to a substrate (e.g., silicon/silicon dioxide coating) as used for the production of a precision integrated circuit element by means of an appropriate coating method, for example, using a spinner or coater. After the application, the resulting photoresist layer is exposed to light through the desired mask, followed by baking and development. Thus, good resist patterns are obtained.

The developing solution for the chemically amplified positive resist composition of the present invention includes an aqueous solution containing, alkali, for example, an inorganic alkali, e.g., sodium hydroxide, potassium hydroxide, sodium carbonate, sodium silicate, sodium phosphate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, an amide, e.g., formamide or acetamide, a quaternary ammonium salt, e.g., tetramethylammonium hydroxide, trimethyl(2-hydroxyethyl)ammonium hydroxide, tetraethylammonium hydroxide, tributylmethylammonium hydroxide, tetraethanolammonium hydroxide, methyltriethanolammonium hydroxide, benzylmethyldiethanolammonium hydroxide, benzyldimethylethanolammonium hydroxide, benzyltriethanolammonium hydroxide, tetrapropylammonium hydroxide or tetrabutylammonium hydroxide, and a cyclic amine, e.g., pyrrole or piperidine.

The present invention is described in more detail with reference to the following examples, but the present invention should not be construed as being limited thereto.

SYNTHESIS EXAMPLE

Synthesis Example (1)

Synthesis of Resin A'-1

Poly(p-hydroxystyrene) (VP15000 manufactured by Nippon Soda Co., Ltd.) (1,800 g) and propylene glycol monomethyl ether acetate (PGMEA) (8,200 g) were dissolved in a flask and the resulting solution was subjected to distillation under a reduced pressure to remove water and PGMEA by azeotropic distillation.

After the confirmation of sufficiently low water content in the solution, a solution containing pyridinium p-toluenesulfonate (9.0 g) dissolved in cyclohexaneethanol (576.2 g) was added thereto, and then tert-butyl vinyl ether (450.2 g) was added thereto, followed by stirring at room temperature for 5 hours.

To the solution were added pyridine (142.2 g) and acetic anhydride (153.2 g) and the solution was stirred at room temperature for 2 hours. To the reaction solution were added water (3.6 liters) and ethyl acetate (7.2 liters), and the mixture was subjected to separation procedure. The organic phase separated was washed with water and distilled under a reduced pressure to remove ethyl acetate, water and an azeotropic amount of PGMEA, whereby an alkali-soluble resin A'-1 having a substituent according to the present invention (30% by weight PGMEA solution) was obtained.

Synthesis Example (2)

Synthesis of Resin A'-2 p-Acetoxystyrene monomer (or p-tert-butoxystyrene monomer) and 4-tert-butylstyrene monomer were polymerized using dimethyl 2,2'-azobisisobutyronitrile (AIBN) as an initiator, followed by subjecting deprotection treatment with hydrochloric acid to obtain p-hydroxystyrene/p-tert-butylstyrene (93/7 by mole) copolymer R-1.

The copolymer R-1 (25 g) and propylene glycol monomethyl ether acetate (PGMEA) (120 g) were dissolved in a flask and the resulting solution was subjected to distillation under a reduced pressure to remove water and PGMEA by azeotropic distillation. After the confirmation of sufficiently low water content in the solution, a solution containing pyridinium. p-toluenesulfonate (0.12 g) dissolved in cyclohexaneethanol (3.5 g) was added thereto, and then tert-butyl vinyl ether (3.4 g) was added thereto, followed by stirring at room temperature for 5 hours.

To the reaction solution was added triethylamine (0.1 g) to terminate the reaction, then were added water (50 ml) and ethyl acetate (100 ml), and the mixture was subjected to separation procedure. The organic phase separated was washed with water and distilled under a reduced pressure to remove ethyl acetate, water and an azeotropic amount of PGMEA, whereby an alkali-soluble resin A'-2 having a substituent according to the present invention (30% by weight PGMEA solution) was obtained.

Synthesis Example (3)

Synthesis of Resin A'-3

Poly(p-hydroxystyrene) (VP15000 manufactured by Nippon Soda Co., Ltd.) (1,800 g) and propylene glycol monomethyl ether acetate (PGMEA) (8,200 g) were dissolved in a flask and the resulting solution was subjected to distillation under a reduced pressure to remove water and PGMEA by azeotropic distillation.

After the confirmation of sufficiently low water content in the solution, a solution containing pyridinium p-toluenesulfonate (9.0 g) dissolved in cyclohexaneethanol (576.2 g) was added thereto, and then tert-butyl vinyl ether (450.2 g) was added thereto, followed by stirring at room temperature for 5 hours.

To the reaction solution were added water (3.6 liters) and ethyl acetate (7.2 liters), and the mixture was subjected to separation procedure. The organic phase separated was washed with water and distilled under a reduced pressure to remove ethyl acetate, water and an azeotropic amount of PGMEA, whereby an alkali-soluble resin A'-3 having a substituent according to the present invention (30% by weight PGMEA solution) was obtained.

Synthesis Example (4)

Synthesis of Resin B'-4

Poly(p-hydroxystyrene) (VP15000 manufactured by Nippon Soda Co., Ltd.) (100 g) and propylene glycol monomethyl ether acetate (PGMEA) (400 g) were dissolved in a flask and the resulting solution was subjected to distillation under a reduced pressure to remove water and PGMEA by azeotropic distillation.

After the confirmation of sufficiently low water content in the solution, ethyl vinyl ether (25.0 g) and p-toluenesulfonic acid (0.02 g) were added thereto, followed by stirring at room temperature for one hour.

To the reaction solution was added triethylamine (0.03 g) to terminate the reaction, then were added water (400 ml) and ethyl acetate (800 ml), and the mixture was subjected to separation procedure. The organic phase separated. was washed with water and distilled under a reduced pressure to remove ethyl acetate, water and an azeotropic amount of PGMEA, whereby an alkali-soluble resin B'-4 having a substituent according to the present invention (30% by weight PGMEA solution) was obtained.

Synthesis Example (5)

Synthesis of Resin B'-5 p-Acetoxystyrene monomer (or p-tert-butoxystyrene monomer) and cyclohexyl acrylate monomer were polymerized using dimethyl 2,2'-azobisisobutyronitrile (AIBN) as an initiator, followed by subjecting deprotection treatment with hydrochloric acid to obtain p-hydroxystyrene/cyclohexyl acrylate (90/10 by mole) copolymer R-2.

The copolymer R-2 (100 g) and propylene glycol monomethyl ether acetate (PGMEA) (400 g) were dissolved in a flask and the resulting solution was subjected to distillation under a reduced pressure to remove water and PGMEA by azeotropic distillation. After the confirmation of sufficiently low water content in the solution, ethyl vinyl ether (25.0 g) and p-toluenesulfonic acid (0.02 g) were added thereto, followed by stirring at room temperature for one hour.

To the reaction solution was added triethylamine (0.03 g) to terminate the reaction, then were added water (400 ml) and ethyl acetate (800 ml), and the mixture was subjected to separation procedure. The organic phase separated was washed with water and distilled under a reduced pressure to remove ethyl acetate, water and an azeotropic amount of PGMEA, whereby an alkali-soluble resin B'-5 having a substituent according to the present invention (30% by weight PGMEA solution) was obtained.

Synthesis Example (6)

Synthesis of Alkali-Soluble Resin R-C1

In 120 ml of butyl acetate was dissolved 32.4 g (0.2 mols) of p-acetoxystyrene, and to the resulting solution was added three times every 2.5 hours 0.033 g of azobisisobutylonitrile (AIBN) while stirring in a nitrogen gas stream at 80° C. Then, the mixture was further stirred for 5 hours to conduct a polymerization reaction. The reaction solution was poured into 1,200 ml of hexane to deposit a white resin. The resin obtained was dried and then dissolved in 150 ml of methanol. To the solution was added a solution of 7.7 g (0.19 mols) of sodium hydroxide dissolved in 50 ml of water and the reaction solution was heated under reflux for 3 hours to conduct hydrolysis. Then, the reaction solution was diluted by adding 200 ml of water and neutralized with hydrochloric acid to deposit a white resin. The resin was collected by filtration, washed with water and dried. The resin was then dissolved in 200 ml of tetrahydrofuran, and the resulting solution was added dropwise to 5 liters of ultrapure water with vigorous stirring to reprecipitate. The reprecipitation procedure was repeated three times. The resin obtained was dried at 120° C. in a vacuum drier for 12 hours to obtain poly(p-hydroxystyrene) as Alkali-Soluble Resin R-C1.

The weight average molecular weight (measured by GPC method and calculated in terms of polystyrene) of the resin obtained was 15,000.

Alkali-Soluble Resin R-C2

Poly(p-hydroxystyrene) (VP8000 manufactured by Nippon Soda Co., Ltd.) was designated as Alkali-Soluble Resin R-C2. The weight average molecular weight of the resin was 9,800.

Synthesis Example (7)

Synthesis of 2-Thienylmethylcarbonyloxyethyl Vinyl Ether (X-1)

In 500 ml of N,N-dimethylacetamide (DMAc) was dissolved 100 g of thiophene-2-acetic acid, and to the resulting solution was added 31 g of sodium hydroxide, followed by stirring at room temperature for 10 minutes. Then, 112 g of 2-chloroethyl vinyl ether was added thereto and the mixture was stirred at 120° C. for 2 hours. The deposition of salt was observed. To the reaction solution were added water and ethyl acetate, and the mixture was subjected to separation procedure. The organic phase was washed three times with water, dried, concentrated and distilled under a reduced pressure to obtain the desired compound (X-1). The desired compound (X-1) was identified by NMR.

Synthesis Example (8)

Synthesis of Thienylcarbonyloxyethyl Vinyl Ether (X-2)

The desired compound (X-2) was obtained in the same manner as in Synthesis Example (7) except for using thenoic acid as the starting material.

Synthesis Example (9)

Synthesis of Vinyloxyethylpyrrolidone (X-3)

The desired compound (X-3) was obtained in the same manner as in Synthesis Example (7) except for using 2-pyrrolidone as the starting material.

Synthesis Example (10)

Synthesis of 2-Thienylethyl Vinyl Ether (X-4)

The desired compound (X-4) was obtained in the same manner as in Synthesis Example (7) except for using 2-thienyl lithium or 2-thienyl magnesium bromide as the starting material.

Synthesis Example (11)

Synthesis of 2-Furylcarbonyloxyethyl Vinyl Ether (X-5)

The desired compound (X-5) was obtained in the same manner as in Synthesis Example (7) except for using 2-furylcarboxylic acid as the starting material.

Synthesis Example (12)

Synthesis of 2-Thienylthioethyl Vinyl Ether (X-6)

The desired compound (X-6) was obtained in the same manner as in Synthesis Example (7) except for using 2-thienylthiol as the starting material.

The structures of Vinyl Ethers (X-1) to (X-6) synthesized above are shown below.

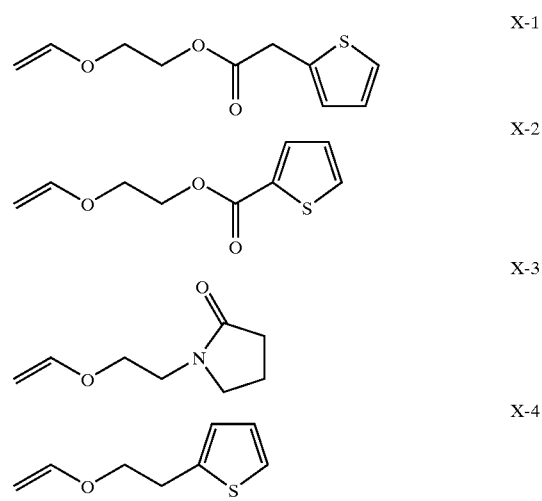

-continued

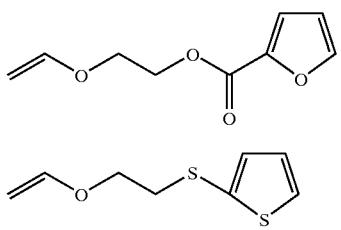

X-5

X-6

Synthesis Example (13)

Synthesis of Resin C-1

In propylene glycol monomethyl ether acetate (PGMEA) (80 g) was dissolved Alkali-Soluble Resin R-C1 (20 g), and the resulting solution was distilled under a reduced pressure to remove water. Then, Vinyl Ether X-1 (11 g) and p-toluenesulfonic acid (40 mg) were added to the solution, followed by stirring at room temperature for 2 hours. To the reaction solution was added triethylamine (42 mg) and then were added ultrapure water and ethyl acetate. The mixture was subjected to separation procedure, followed by washing the organic phase three times with water. The organic phase obtained was distilled under a reduced pressure to remove ethyl acetate and water, whereby an alkali-soluble resin C-1 having a substituent according to the present invention was obtained.

Synthesis Examples (14) to (18)

Synthesis of Resins C-2 to C-6

Resins C-2 to C-6 were synthesized in the same manner as in Synthesis Example (13) except for changing the resin for starting material and vinyl ether as shown in Table 1 below, respectively.

Synthesis Example (19)

Synthesis of Resin C-7

In propylene glycol monomethyl ether acetate (PGMEA) (80 g) was dissolved Alkali-Soluble Resin R—C1 (20 g), and the resulting solution was distilled under a reduced pressure to remove water. Then, Vinyl Ether X-1 (11 g) and p-toluenesulfonic acid (40 mg) were added to the solution, followed by stirring at room temperature for 2 hours. To the reaction solution were added pyridine (2.0 g) and acetic anhydride (2.1 g), and the mixture was stirred for one hour. Then, ultrapure water and ethyl acetate were added thereto and the mixture was subjected to separation procedure, followed by washing the organic phase three times with water. The organic phase obtained was distilled under a reduced pressure to remove ethyl acetate and water, whereby an alkali-soluble resin C-7 having a substituent according to the present invention was obtained.

Synthesis Examples (20) to (24)

Synthesis of Resins C-8 to C-12

Resins C-8 to C-12 were synthesized in the same manner as in Synthesis Example (19) except for changing the resin for starting material and vinyl ether as shown in Table 1 below, respectively.

Synthesis Examples (25) to (30)

Synthesis of Resins C-13 to C-18

Resins C-13 to C-18 were synthesized in the same manner as in Synthesis Examples (13) to (18) except for using Alkali-Soluble Resin R-C2 in place of Alkali-Soluble Resin R-C1 as the resin for starting material, respectively.

Synthesis Examples (31) to (36)

Synthesis of Resins C-19 to C-24

Resins C-19 to C-24 were synthesized in the same manner as in Synthesis Examples (19) to (24) except for using Alkali-Soluble Resin R-C2 in place of Alkali-Soluble Resin R-C1 as the resin for starting material, respectively.

TABLE 1

| Synthesis Example | Resin Synthesized | Resin for Starting Material | Vinyl Ether |
|---|---|---|---|
| 13 | C-1 | R-C1 | X-1 |
| 14 | C-2 | R-C1 | X-2 |
| 15 | C-3 | R-C1 | X-3 |
| 16 | C-4 | R-C1 | X-4 |
| 17 | C-5 | R-C1 | X-5 |
| 18 | C-6 | R-C1 | X-6 |
| 19 | C-7 | R-C1 | X-1 |
| 20 | C-8 | R-C1 | X-2 |
| 21 | C-9 | R-C1 | X-3 |
| 22 | C-10 | R-C1 | X-4 |
| 23 | C-11 | R-C1 | X-5 |
| 24 | C-12 | R-C1 | X-6 |
| 25 | C-13 | R-C2 | X-1 |
| 26 | C-14 | R-C2 | X-2 |
| 27 | C-15 | R-C2 | X-3 |
| 28 | C-16 | R-C2 | X-4 |
| 29 | C-17 | R-C2 | X-5 |
| 30 | C-18 | R-C2 | X-6 |
| 31 | C-19 | R-C2 | X-1 |
| 32 | C-20 | R-C2 | X-2 |
| 33 | C-21 | R-C2 | X-3 |
| 34 | C-22 | R-C2 | X-4 |
| 35 | C-23 | R-C2 | X-5 |
| 36 | C-24 | R-C2 | X-6 |

Examples 1 to 37 and Comparative Examples 1 to 6

Each of the components described in Tables 2 to 4 shown below was dissolved in a mixed solvent of propylene glycol monomethyl ether acetate (PGMEA)/propylene glycol monomethyl ether (PGME) (weight ratio: 8/2) to prepare a solution having a solid content of 12% by weight (including 97.8% by weight of the resin, 2.0% by weight of the photo-acid generator and 0.2% by weight of the organic basic compound). The resulting solution was filtered through a microfilter having a pore size of 0.1 $\mu$m, whereby a positive resist solution for each of Examples 1 to 37 and Comparative Examples 1 to 6 was prepared.

<Evaluation of Linewidth Variation Rate>

The positive resist solution thus obtained was coated on a bare silicon substrate using a spin coater (Mark 8 manufactured by Tokyo Electron Ltd.) and dried at 90° C. for 90 seconds to prepare a resist film having thickness of about 0.495 $\mu$m and a resist film having thickness of about 0.530 $\mu$m.

The resist film having thickness of about 0.495 $\mu$m was exposed with a line and space (1/1) pattern composed of five successive lines of 0.25 $\mu$m using a KrF excimer laser stepper (FPA-3000EX5 manufactured by Canon Inc., wavelength=248 nm, NA=0.60, sigma=0.75). The exposed resist film was subjected to heat treatment at 110° C. for 90 seconds, developed with a 2.38% aqueous tetramethylammonium hydroxide (TMAH) solution, rinsed with pure water and spin-dried to form a resist pattern. Linewidth ($CD_o$) of the 0.25 μm line pattern formed by the exposure in the optimum amount for reproducing the 0.25 μm line and space (1/1) pattern was determined by CD-SEM (S-9220 manufactured by Hitachi Ltd.).

With the resist film having thickness of about 0.530 μm, a resist pattern was formed in the same manner as described above using the above-described optimum exposure amount. Linewidth ($CD_1$) of the 0.25 μm line pattern thus formed was determined by the CD-SEM.

Based on the values obtained above, the linewidth variation rate was defined as follows:

$$\text{Linewidth Variation Rate} = \{(CD_o - CD_1)/CD_o\} \times 100(\%)$$

The results obtained are shown in Tables 5 to 6 below.

TABLE 2

| | Resin (weight ratio) | Photo-Acid Generator (weight ratio) | Organic Basic Compound |
|---|---|---|---|
| Example 1 | A'-1/C-2 = 7/3 | PAG4-4/PAG7-3 = 5/5 | E-5 |
| Example 2 | A'-1/B'-4/C-2 = 5/2/3 | PAG4-4/PAG7-3 = 5/5 | E-5 |
| Example 3 | B'-4/C-2 = 7/3 | PAG4-4/PAG7-3 = 5/5 | E-5 |
| Example 4 | A'-1/C-2 = 7/3 | PAG4-4/PAG7-3 = 5/5 | E-6 |
| Example 5 | A'-1/B'-4/C-2 = 5/2/3 | PAG4-4/PAG7-3 = 5/5 | E-6 |
| Example 6 | B'-4/C-2 = 7/3 | PAG4-4/PAG7-3 = 5/5 | E-6 |
| Example 7 | A'-1/C-4 = 7/3 | PAG4-4/PAG7-3 = 5/5 | E-5 |
| Example 8 | A'-1/B'-4/C-4 = 5/2/3 | PAG4-4/PAG7-3 = 5/5 | E-5 |
| Example 9 | B'-4/C-4 = 7/3 | PAG4-4/PAG7-3 = 5/5 | E-5 |
| Example 10 | A'-1/C-2 = 7/3 | PAG4-5/PAG7-3 = 5/5 | E-6 |
| Example 11 | A'-1/B'-4/C-2 = 5/2/3 | PAG4-5/PAG7-3 = 5/5 | E-6 |
| Example 12 | B'-4/C-2 = 7/3 | PAG4-5/PAG7-3 = 5/5 | E-6 |
| Example 13 | A'-1/C-1 = 7/3 | PAG4-4/PAG7-3 = 5/5 | E-6 |
| Example 14 | A'-1/C-3 = 7/3 | PAG4-4/PAG7-3 = 5/5 | E-6 |
| Example 15 | A'-1/C-5 = 7/3 | PAG4-4/PAG7-3 = 5/5 | E-6 |
| Example 16 | A'-1/C-6 = 7/3 | PAG4-4/PAG7-3 = 5/5 | E-6 |
| Example 17 | A'-1/C-7 = 7/3 | PAG4-4/PAG7-3 = 5/5 | E-6 |
| Example 18 | A'-1/C-8 = 7/3 | PAG4-4/PAG7-3 = 5/5 | E-6 |
| Example 19 | A'-1/C-9 = 7/3 | PAG4-4/PAG7-3 = 5/5 | E-6 |
| Example 20 | A'-1/C-10 = 7/3 | PAG4-4/PAG7-3 = 5/5 | E-6 |

TABLE 3

| | Resin (weight ratio) | Photo-Acid Generator (weight ratio) | Organic Basic Compound |
|---|---|---|---|
| Example 21 | A'-1/C-11 = 7/3 | PAG4-4/PAG7-3 = 5/5 | E-6 |
| Example 22 | A'-1/C-12 = 7/3 | PAG4-4/PAG7-3 = 5/5 | E-6 |
| Example 23 | A'-1/C-13 = 7/3 | PAG4-4/PAG7-3 = 5/5 | E-6 |
| Example 24 | A'-1/C-14 = 7/3 | PAG4-4/PAG7-3 = 5/5 | E-6 |
| Example 25 | A'-1/C-15 = 7/3 | PAG4-4/PAG7-3 = 5/5 | E-6 |
| Example 26 | A'-1/C-16 = 7/3 | PAG4-4/PAG7-3 = 5/5 | E-6 |
| Example 27 | A'-1/C-17 = 7/3 | PAG4-4/PAG7-3 = 5/5 | E-6 |
| Example 28 | A'-1/C-18 = 7/3 | PAG4-4/PAG7-3 = 5/5 | E-6 |
| Example 29 | A'-1/C-19 = 7/3 | PAG4-4/PAG7-3 = 5/5 | E-6 |
| Example 30 | A'-1/C-20 = 7/3 | PAG4-5/PAG7-3 = 5/5 | E-6 |
| Example 31 | A'-1/C-21 = 7/3 | PAG4-5/PAG7-3 = 5/5 | E-6 |
| Example 32 | B'-4/C-22 = 7/3 | PAG4-5/PAG7-3 = 5/5 | E-6 |
| Example 33 | A'-1/C-23 = 7/3 | PAG4-4/PAG7-3 = 5/5 | E-6 |
| Example 34 | A'-1/C-24 = 7/3 | PAG4-4/PAG7-3 = 5/5 | E-6 |
| Example 35 | A'-2/C-2 = 7/3 | PAG4-4/PAG7-3 = 5/5 | E-6 |
| Example 36 | A'-3/C-2 = 7/3 | PAG4-4/PAG7-3 = 5/5 | E-6 |
| Example 37 | B'-5/C-2 = 7/3 | PAG4-4/PAG7-3 = 5/5 | E-6 |

TABLE 4

| | Resin (weight ratio) | Photo-Acid Generator (weight ratio) | Organic Basic Compound |
|---|---|---|---|
| Comparative Example 1 | A'-1 alone | PAG4-4/PAG7-3 = 5/5 | E-5 |
| Comparative Example 2 | A'-1/B'-4 = 5/5 | PAG4-4/PAG7-3 = 5/5 | E-5 |
| Comparative Example 3 | B'-4 alone | PAG4-4/PAG7-3 = 5/5 | E-5 |
| Comparative Example 4 | A'-2 alone | PAG4-4/PAG7-3 = 5/5 | E-5 |
| Comparative Example 5 | A'-3 alone | PAG4-4/PAG7-3 = 5/5 | E-5 |
| Comparative Example 6 | B'-5 alone | PAG4-4/PAG7-3 = 5/5 | E-5 |

TABLE 5

| | Linewidth Variation Rate (%) |
|---|---|
| Example 1 | 25 |
| Example 2 | 25 |
| Example 3 | 23 |
| Example 4 | 24 |
| Example 5 | 25 |
| Example 6 | 23 |
| Example 7 | 23 |
| Example 8 | 23 |
| Example 9 | 21 |
| Example 10 | 26 |
| Example 11 | 26 |
| Example 12 | 25 |
| Example 13 | 27 |
| Example 14 | 27 |
| Example 15 | 26 |
| Example 16 | 24 |
| Example 17 | 28 |

TABLE 5-continued

| | Linewidth Variation Rate (%) |
|---|---|
| Example 18 | 26 |
| Example 19 | 26 |
| Example 20 | 27 |
| Example 21 | 28 |
| Example 22 | 26 |
| Example 23 | 27 |
| Example 24 | 27 |
| Example 25 | 25 |
| Example 26 | 25 |
| Example 27 | 26 |
| Example 28 | 26 |
| Example 29 | 25 |
| Example 30 | 27 |
| Example 31 | 27 |
| Example 32 | 26 |
| Example 33 | 28 |
| Example 34 | 28 |
| Example 35 | 28 |
| Example 36 | 27 |
| Example 37 | 28 |

TABLE 6

| | Linewidth Variation Rate (%) |
|---|---|
| Comparative Example 1 | 55 |
| Comparative Example 2 | 53 |
| Comparative Example 3 | 50 |
| Comparative Example 4 | 58 |
| Comparative Example 5 | 54 |
| Comparative Example 6 | 55 |

The organic basic compounds (E-5) and (E-6) used have the following structures, respectively.

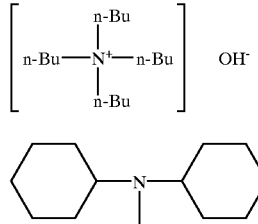

(E-5)

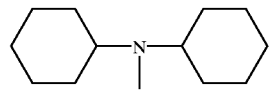

(E-6)

It is apparent from the results shown in Tables 5 and 6 that the positive resist compositions of the present invention exhibit the remarkably suppressed linewidth variation rate in comparison with the positive resist compositions for comparison.

According to the present invention, a positive resist composition in which the linewidth variation rate caused by fluctuation of thickness of a resist film on a highly reflective substrate having irregularities (for example, bare silicon substrate or polysilicon substrate) is remarkably suppressed can be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive resist composition comprising (a) a resin (A), which is decomposed by the action of an acid to increase solubility in an alkali developing solution, containing a structural unit including a group represented by formula (X) shown below and/or a resin (B), which is decomposed by the action of an acid to increase solubility in an alkali developing solution, containing a structural unit including a group represented by formula (Y) shown below, and a resin (C), which is decomposed by the action of an acid to increase solubility in an alkali developing solution, containing a structural unit including a group represented by formula (Q) shown below; and (b) a compound that generates an acid upon irradiation of an actinic ray or radiation.

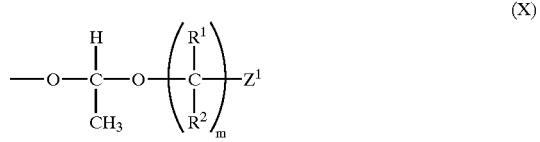

(X)

wherein, $R^1$ and $R^2$, which may be the same or different, each represent a hydrogen atom or an alkyl group which may have a substituent; m represents an integer of from 1 to 20; and $Z^1$ represents

wherein, $R^3$ represents an alkyl group which may have a substituent, an aryl group which may have a substituent or an aralkyl group which may have a substituent; and n represents an integer of from 0 to 5,

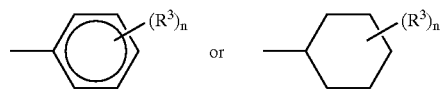

(Y)

wherein, $R^4$ represents an alkyl group,

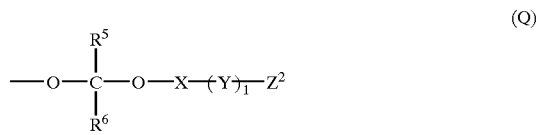

(Q)

wherein, $R^5$ and $R^6$, which may be the same or different, each represent a hydrogen atom or an alkyl group; X represents an alkylene group which may have a substituent; Y represents a divalent connecting group; $Z^2$ represents a heterocyclic group which may have a substituent; and l represents 0 or 1.

2. The positive resist composition as claimed in claim 1, wherein the compound that generates an acid upon irradiation of an actinic ray or radiation of component (b) is a compound having a sulfonium salt structure or a compound having a diazodisulfone structure.

3. The positive resist composition as claimed in claim 1, wherein the compound that generates an acid upon irradiation of an actinic ray or radiation of component (b) is a combination of a compound having a sulfonium salt structure and a compound having a diazodisulfone structure.

4. The positive resist composition as claimed in claim 1, wherein the resin (A) is a resin having the group represented by formula (X) in the side chain thereof.

5. The positive resist composition as claimed in claim 1, wherein a content of the structural unit including a group represented by formula (X) in the resin (A) is from 5 to 50% by mole based on the total repeating unit of the resin.

6. The positive resist composition as claimed in claim 1, wherein the resin (B) is a resin having the group represented by formula (Y) in the side chain thereof.

7. The positive resist composition as claimed in claim 1, wherein a content of the structural unit including a group represented by formula (Y) in the resin (B) is from 5 to 70% by mole based on the total repeating unit of the resin.

8. The positive resist composition as claimed in claim 1, wherein a content of the resin (A) and/or resin (B) in the positive resist composition is from 25 to 98.998% by weight based on the total solid content of the positive resist composition.

9. The positive resist composition as claimed in claim 1, wherein the resin (C) is a resin having the group represented by formula (Q) in the side chain thereof.

10. The positive resist composition as claimed in claim 1, wherein a content of the structural unit including a group represented by formula (Q) in the resin (C) is from 5 to 50% by mole based on the total repeating unit of the resin.

11. The positive resist composition as claimed in claim 1, wherein a content of the resin (C) in the positive resist composition is from 1.0 to 70% by weight based on the total solid content of the positive resist composition.

12. The positive resist composition as claimed in claim 1, wherein an amount of the compound that generates an acid upon irradiation of an actinic ray or radiation of component (b) is from 0.001 to 40% by weight based on the total solid content of the positive resist composition.

13. The positive resist composition as claimed in claim 1, wherein the positive resist composition further comprises an organic basic compound.

14. The positive resist composition as claimed in claim 13, wherein the organic basic compound is a compound having a structure represented by any one of the following formulae (A) to (E):

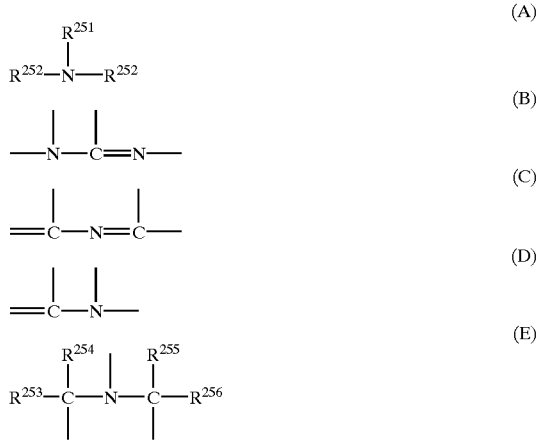

wherein $R^{250}$, $R^{251}$ and $R^{252}$, which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{250}$ and $R^{251}$ may be combined with each other to form a ring; and $R^{253}$, $R^{254}$, $R^{255}$ and $R^{256}$, which may be the same or different, each represent an alkyl group having from 1 to 6 carbon atoms.

15. The positive resist composition as claimed in claim 1, wherein the positive resist composition further comprises a surface active agent.

16. The positive resist composition as claimed in claim 15, wherein the surface active agent is a fluorine-based or silicon-based surface active agent.

17. The positive resist composition as claimed in claim 1, wherein the positive resist composition further comprises a solvent.

* * * * *